(12) United States Patent
Bae

(10) Patent No.: US 6,716,679 B2
(45) Date of Patent: Apr. 6, 2004

(54) METHODS OF FORMING FUSE BOX GUARD RINGS FOR INTEGRATED CIRCUIT DEVICES

(75) Inventor: Myoung-Kwang Bae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/364,942

(22) Filed: Feb. 12, 2003

(65) Prior Publication Data

US 2003/0168715 A1 Sep. 11, 2003

(30) Foreign Application Priority Data

Mar. 11, 2002 (KR) ........................................ 2002-12917

(51) Int. Cl.[7] .............................................. H01L 21/82
(52) U.S. Cl. ........................ 438/132; 438/601; 257/529
(58) Field of Search ................................. 438/132, 601, 438/131, 600; 257/529, 530

(56) References Cited

U.S. PATENT DOCUMENTS

| | | | | |
|---|---|---|---|---|
| 5,970,346 A | * | 10/1999 | Liaw | 438/281 |
| 6,100,118 A | * | 8/2000 | Shih et al. | 438/132 |
| 6,121,073 A | * | 9/2000 | Huang et al. | 438/132 |
| 6,162,686 A | * | 12/2000 | Huang et al. | 438/281 |
| 6,255,715 B1 | * | 7/2001 | Liaw | 257/529 |
| 6,507,086 B1 | * | 1/2003 | Minn et al. | 257/529 |
| 6,525,398 B1 | * | 2/2003 | Kim et al. | 257/529 |
| 6,573,125 B2 | * | 6/2003 | Bae | 438/132 |

FOREIGN PATENT DOCUMENTS

JP          9069571          3/1997

* cited by examiner

Primary Examiner—John Niebling
Assistant Examiner—Jennifer M. Kennedy
(74) Attorney, Agent, or Firm—Myers Bigel Sibley & Sajovec PA

(57) ABSTRACT

The present invention provides methods of forming fuse box guard rings for integrated circuits and integrated circuit devices having the same. A fuse line is formed at a fuse portion of an integrated circuit device and a first insulating layer is formed on the fuse line. A guard ring pattern that encloses the fuse line is formed on the first insulating layer. A second insulating layer is formed on the guard ring pattern and the first insulating layer. The second insulating layer is partially etched to remove a portion of the second insulting layer in the fuse portion of the integrated circuit device enclosed by the guard ring pattern exposing a portion of the first insulating layer and to form a via hole in a peripheral circuit region of the integrated circuit device.

20 Claims, 18 Drawing Sheets

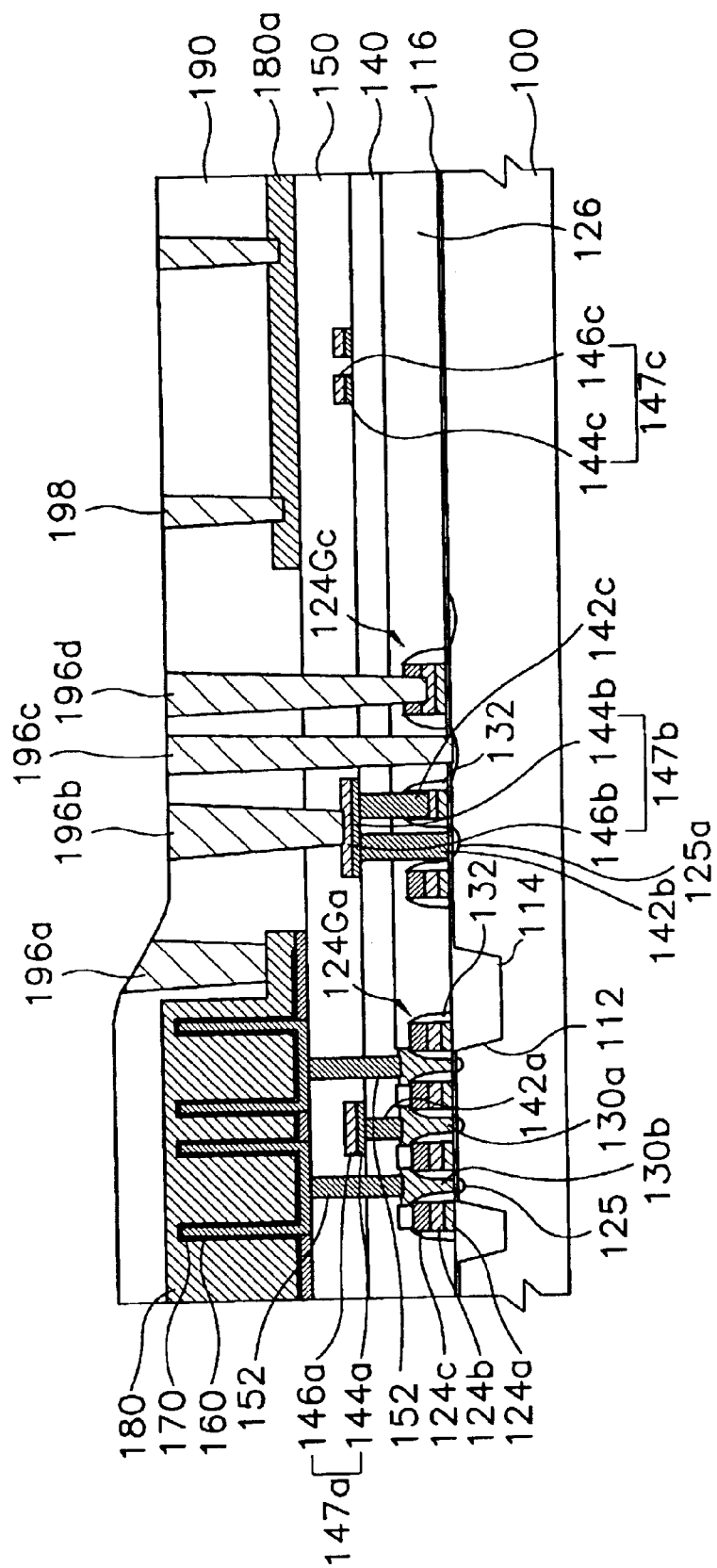

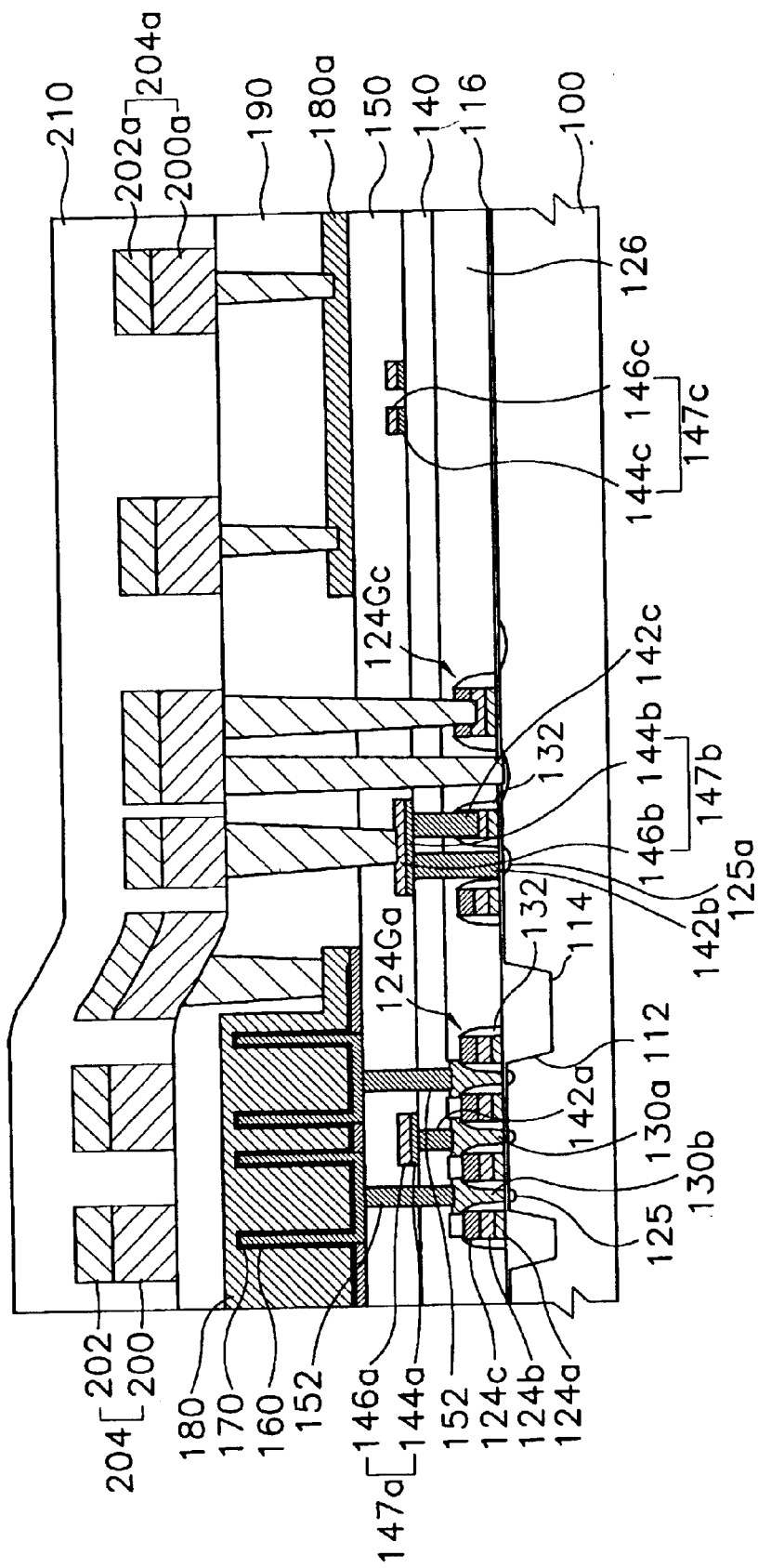

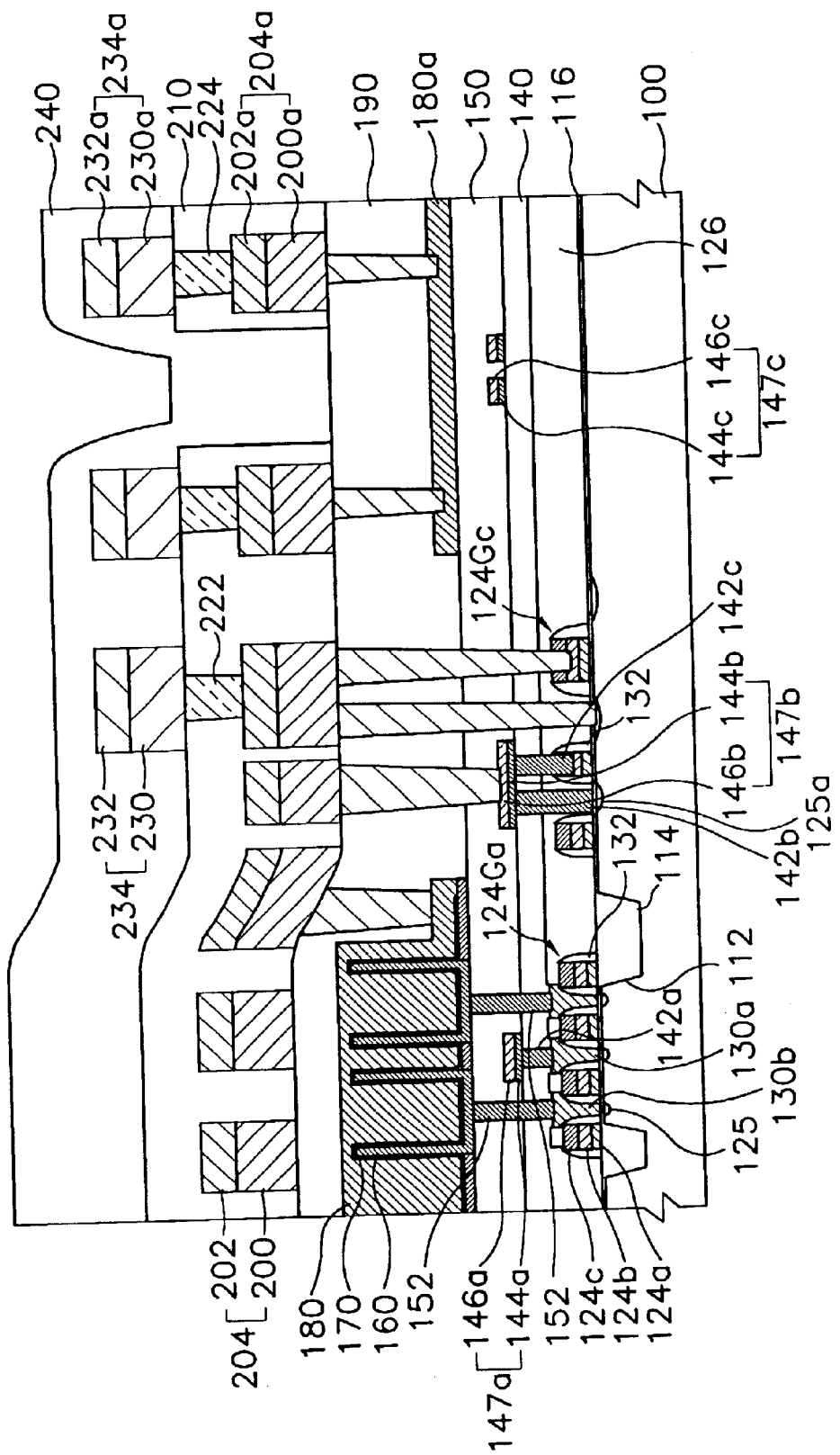

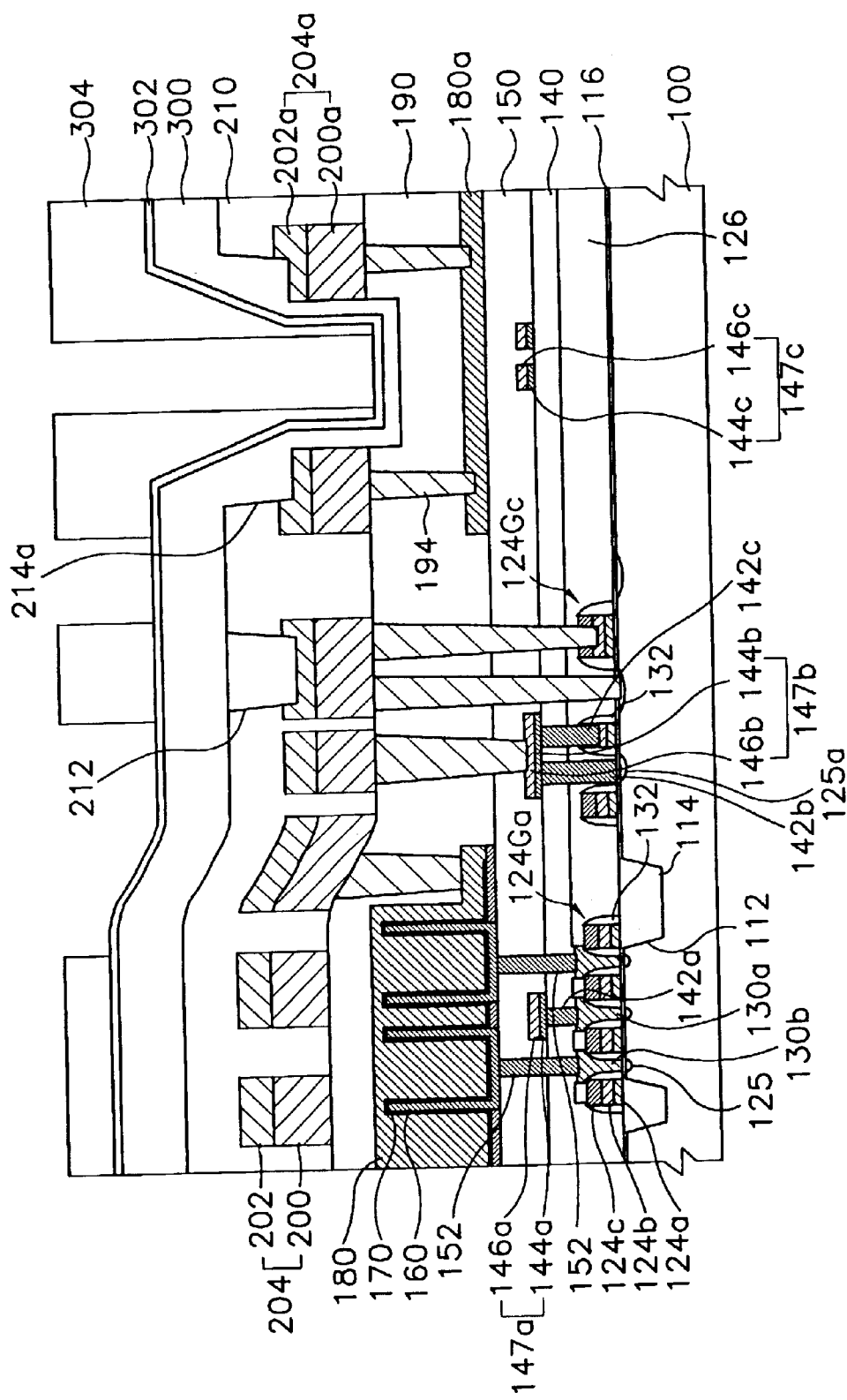

METHODS OF FORMING FUSE BOX GUARD RINGS FOR INTEGRATED CIRCUIT DEVICES

RELATED APPLICATIONS

This application is related to and claims priority from Korean Application No. 2002-12917, filed Mar. 11, 2002, the disclosure of which is hereby incorporated herein by reference.

FIELD OF THE INVENTION

The present invention relates to integrated circuit devices and methods of fabricating integrated circuit devices and, more particularly, to methods of fabricating integrated circuit devices having fuse boxes and integrated circuit devices having the same.

BACKGROUND OF THE INVENTION

The manufacturing process of integrated circuit devices typically includes both a fabrication process and an assembly process. The fabrication process may include repeatedly forming predetermined circuit patterns on a substrate, for example, a silicon (Si) substrate, to produce a cell, for example, a memory cell. These cells are typically packaged during the assembly process, i.e. multiple cells are packaged in a single chip.

Between the fabrication process and the assembly process, an electrical die sorting (EDS) process may be performed to detect certain electrical proprieties of the cells formed on the substrate. The EDS process may indicate whether or not the cells formed on the substrate have adequate electrical properties. If it is determined that a cell formed on the substrate has inadequate electrical properties, the poor electrical properties may be removed during the EDS process before the assembly process is performed. The removal of cells having poor electrical properties before assembly of the packages may reduce manufacturing costs and simplify the assembly process.

In particular, the EDS process typically comprises a pre-laser test step, a repairing step and a post-laser test step. Data is generated with respect to the cells formed on the substrate during the pre-laser test step. Poor cells are located using the generated data and the reparable poor cells are repaired on the basis of the generated data during the repairing step. Finally, the repaired cells are retested during the post-laser test step to determine if the cells have actually been repaired.

During the repairing step of the EDS process, wirings connected to the poor cells may be cut by the irradiation of a laser, and the poor cells that are located are replaced with redundancy cells provided on the chip for this purpose. The wiring that is cut during the irradiation of the laser is a fuse of the integrated circuit device. The region of the integrated circuit device including the fuse and the portion of the integrated circuit device enclosing the fuse is a fuse portion of the integrated circuit device. The fuse portion of the integrated circuit device may include a fuse line, e.g. a portion of a bit line of the integrated circuit device that is cut by the irradiation of the laser. A fuse opening may be formed over the fuse line by etching an insulating interlayer and a passivation layer. The fuse line may be cut by, for example, irradiating a laser onto the fuse line through the fuse opening. Fuses and issues related thereto are discussed in U.S. Pat. Nos. 6,714,753 to Wen-Shiang Liao and 6,284,575 to Suk-Soo Kim, the disclosures of which are hereby incorporated herein by reference as if set forth in full.

The insulating layer generally includes an insulation material, for example, silicon oxide. In particular, the insulating layer may include an insulation material having a good step coverage, for example, borophosphosilicate glass (BPSG), phosphosilicate glass (PSG), spin-on-glass (SOG) or tetraethyl orthosilicate (TEOS), in order to reduce a step in a cell array region. When an insulating layer includes an insulation material including impurities, the interlayer dielectric may become sensitive to moisture.

Accordingly, a reliability test may be performed on the integrated circuit device under a high moisture content, a high temperature and/or a high pressure to determine whether or not the integrated circuit device can operate under these circumstances. If moisture permeates into the integrated circuit device through the insulating layer, the reliability of the integrated circuit device may be reduced because the moisture may influence the integrity of the metal wirings positioned around the fuse portion of the integrated circuit device.

To address the influence of moisture on the integrated circuit device, rectangular shaped guard rings that include metal around a fuse opening of a fuse portion of an integrated circuit device have been provided. This technique is discussed, for example, in Japanese Patent Laid-Open Publication No. 1997-69571 and will be discussed further below with respect to FIGS. 1 and 2.

Referring now to FIGS. 1 and 2, a cross-sectional view and a plan view illustrating integrated circuit devices having rectangular shaped guard rings around a fuse opening as described in the Japanese Patent Publication set out above will be described. As illustrated in FIGS. 1 and 2, a field oxide layer 2 is formed on an integrated circuit substrate 1 to define a cell region of an integrated circuit device. A fuse portion is formed on the field oxide layer 2. In particular, a polysilicon wiring layer 3 is formed on the field oxide layer 2 and functions as a bit line. A first interlayer dielectric (insulating layer) 4 of, for example, silicon oxide, is formed on the polysilicon wiring layer 3 to cover the polysilicon wiring layer 3. An opening 5 is formed on the first interlayer dielectric 4 and partially exposes the polysilicon wiring layer 3.

A polysilicon layer is formed in the opening 5 and on the first interlayer dielectric 4 and is patterned to form a polysilicon layer pattern 6 that connects one portion of the remaining polysilicon wiring layer 3 to another portion of the remaining polysilicon wiring layer 3. A first silicon oxide film 16 is formed on the polysilicon layer pattern 6 and the first interlayer dielectric 4. A polysilicon layer 15 is formed on the first silicon oxide film 16 to cover the fuse portion. The polysilicon layer 15 functions as an etch stop layer of the integrated circuit device and is simultaneously formed when an upper electrode of a capacitor of the integrated circuit device is formed.

A second silicon oxide film 7 is formed on the polysilicon layer 15 and the first silicon oxide film 16, and a planar second interlayer dielectric 8 is formed on the second silicon oxide film 7 using a material having a good fluidity, for example, BPSG. After a rectangular ring shaped first opening 17 enclosing the fuse portion is formed in the second interlayer dielectric 8, a metal layer is formed on the surface of the second interlayer dielectric 8 and in the first opening 17. The metal layer includes, for example, aluminum, and is formed by, for example, a sputtering process. The obtained metal layer is patterned to form a first metal wiring 9 in a cell region of the integrated circuit substrate 1, and a lower guard ring 50 in the fuse portion of the integrated circuit substrate 1. The lower guard ring 50 includes a first lower metal layer 25 in the first opening 17, and a first upper metal layer 20 disposed on the first opening 17.

A third interlayer dielectric 21 that includes, for example, silicon oxide, is formed on the second interlayer dielectric 8 to cover the first metal wiring 9 and the first upper metal layer 20. A rectangular ring shaped second opening 22 exposing the lower guard ring 50 is formed on the third interlayer dielectric 21. A metal layer is formed on the surface of the third interlayer dielectric 21 using, for example, aluminum and a sputtering process. A metal layer is formed in the second opening 22 and patterned to form a second metal wiring 27 in the cell region of the integrated circuit substrate 1, and an upper guard ring 60 in the fuse portion. The upper guard ring 60 includes a second lower metal layer 26 in the second opening 22, and a second upper metal layer 23 disposed on the second opening 22.

A photo resist pattern (not shown) that exposes the fuse portion is formed on a passivation film 10 after the passivation film 10 is formed on the resultant structure of the integrated circuit substrate 1. The third interlayer dielectric 21 and the second interlayer dielectric 8 are successively etched by using the photo resist pattern as an etching mask. The etching process is performed to etch the polysilicon layer 15, which functions as the etch stop layer, thereby forming a fuse opening 24 having a rectangular shape.

Although this method may address problems caused by the influence of moisture on an integrated circuit device, other characteristics of the integrated circuit device may suffer if this method is employed. For example, because the rectangular shaped fuse opening 24 is formed by etching several films after the passivation film 10, this may increase the etching time for the fuse opening and, therefore, decrease the throughput of the integrated circuit device. Accordingly, improved methods of forming integrated circuit devices having fuse box guard rings may be desired.

SUMMARY OF THE INVENTION

Embodiments of the present invention provide methods of forming fuse box guard rings for integrated circuits and integrated circuit devices having the same. Methods according to embodiments of the present invention include forming a fuse line at a fuse portion of an integrated circuit device and forming a first insulating layer on the fuse line. A guard ring pattern that encloses the fuse line is formed on the first insulating layer. A second insulating layer is formed on the guard ring pattern and the first insulating layer. The second insulating layer is partially etched to remove a portion of the second insluting layer in the fuse portion of the integrated circuit device enclosed by the guard ring pattern exposing a portion of the first insulating layer and to form a via hole in a peripheral circuit region of the integrated circuit device.

In some embodiments of the present invention, an etch stop layer may be formed between the fuse line and the first insulating layer. A fuse contact hole may be formed in the first insulating layer that partially exposes the etch stop layer and encloses the fuse line and a fuse contact plug may be formed in the fuse contact hole. The guard ring pattern may then be formed on the fuse contact plug.

In further embodiments of the present invention, the second insulating layer may be further etched to form a second fuse contact hole that exposes the guard ring pattern and encloses the fuse line. A second guard ring pattern may be formed on the second fuse contact that encloses the fuse line. A passivation layer may be formed on the integrated circuit device and a fuse opening may be formed in a portion of the integrated circuit device enclosed by the first and second guard ring patterns by etching through the passivation layer, the first insulating layer and the etch stop layer.

In still further embodiments of the present invention, the passivation layer may be formed on the first and second guard ring patterns, the second insulating layer and on the portion first insulating layer exposed by removing a portion of the second insulating layer. A third insulating layer may be formed on a substrate. The fuse line may include a first layer of polysilicon on the third insulating layer and a second layer of metal silicide on the first layer of polysilicon.

In some embodiments of the present invention, the first guard ring pattern may include a first metal layer on the first contact plug and a first metal compound layer on the first metal layer. The second guard ring pattern may include a second metal layer on the second contact plug and a second metal compound layer on the second metal layer. In certain embodiments of the present invention, the first guard ring pattern may have a rectangular shape that encloses the fuse line and the second guard ring pattern may also have a rectangular shape that encloses the fuse line. The first and second metal layers may include aluminum and the first and second metal compound layers may include titanium nitride.

In further embodiments of the present invention, an etch stop layer may be formed between the fuse line and the first insulating layer. A metal layer may be formed on a surface of the integrated circuit device and a compound metal layer may be formed on the metal layer. The metal layer and the metal compound layer may be etched to form a second guard ring pattern that encloses the fuse line on the first guard ring pattern. A passivation layer may be formed on the surface of the integrated circuit device and a fuse opening may be formed in a portion of the integrated circuit device enclosed by the first and second guard ring patterns by etching through the passivation layer, the first insulating layer and the etch stop layer.

In still further embodiments of the present invention, the passivation layer may include a first passivation film on the surface of the integrated circuit device and a second passivation film on the first passivation film. A fuse opening may be formed by etching through the first and second passivation films.

While the present invention is described above primarily with reference to methods of fabricating integrated circuit devices, integrated circuit devices are also provided.

BRIEF DESCRIPTION OF THE DRAWINGS

FIGS. 3A to 3K are cross sectional views illustrating processing steps in the fabrication of integrated circuits having fuse box guard rings according to embodiments of the present invention;

FIGS. 5A to 5D are cross sectional views illustrating processing steps in the fabrication of integrated circuits having fuse box guard rings according to further embodiments of the present invention.

DETAILED DESCRIPTION OF EMBODIMENTS OF THE PRESENT INVENTION

Figure 1:
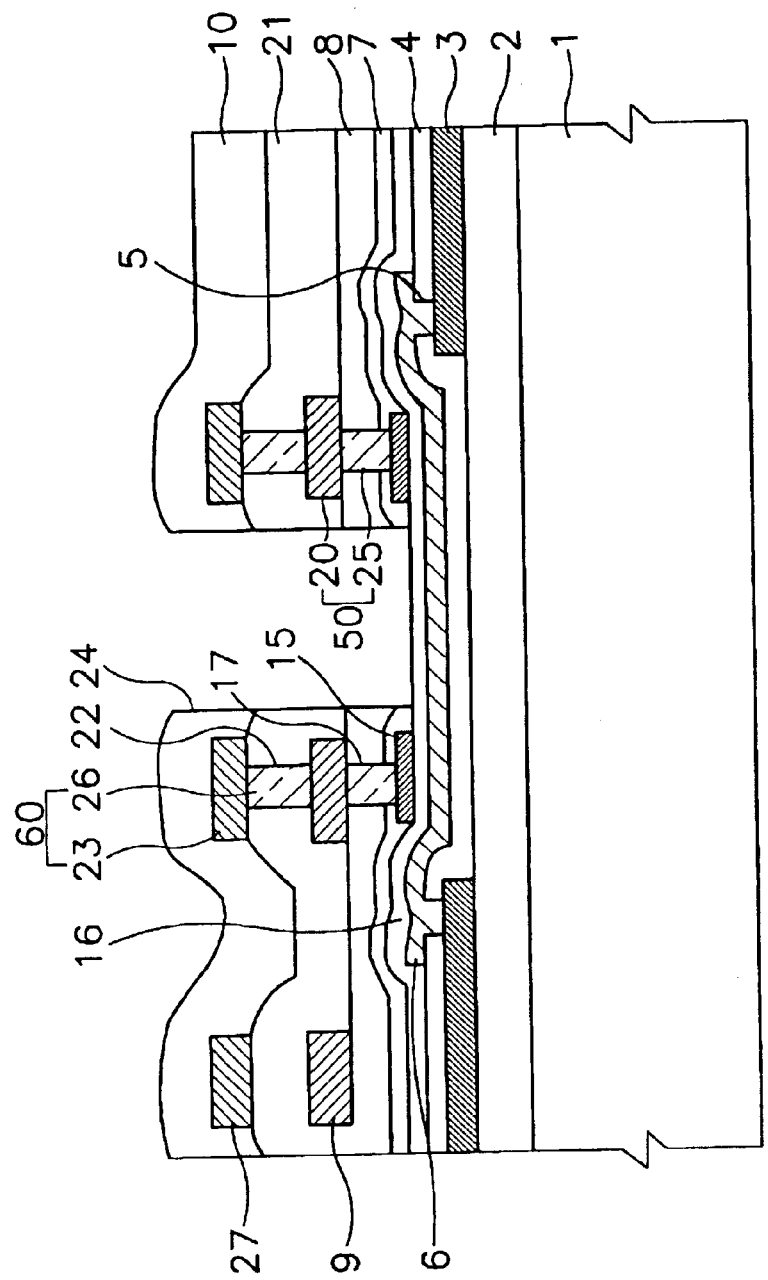
FIG. 1 is a cross-sectional view illustrating conventional integrated circuit devices.
Figure 2:
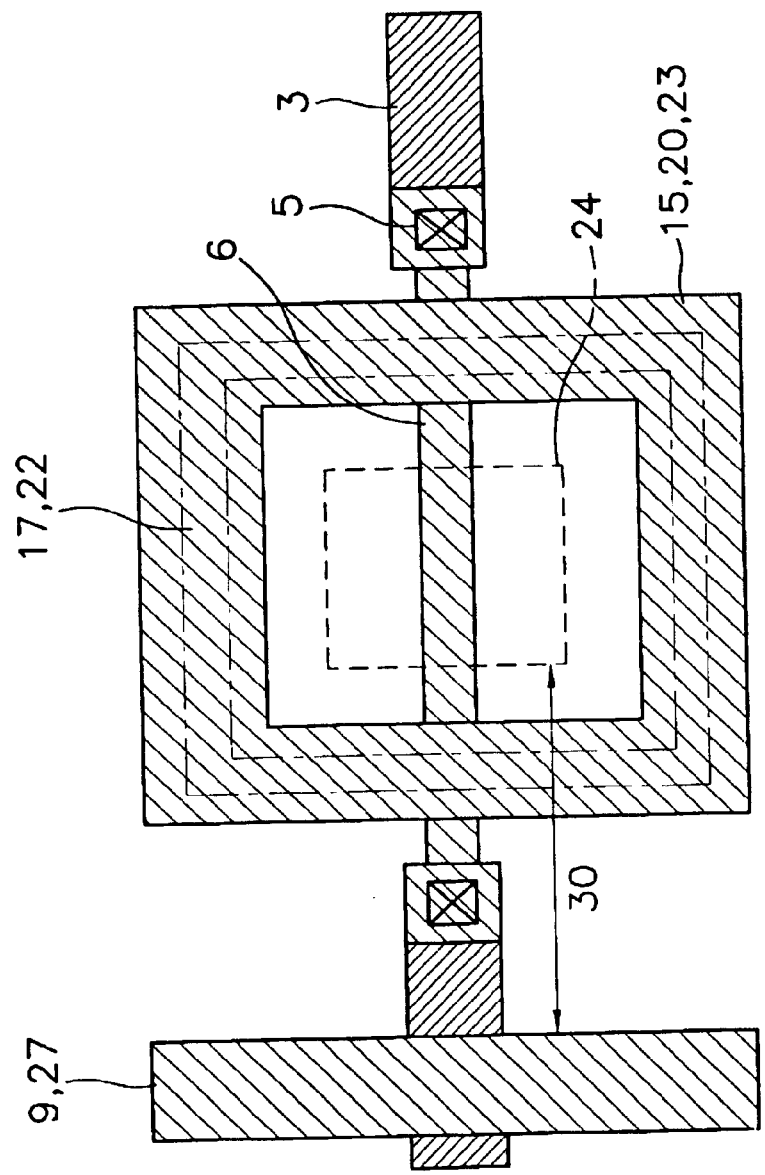
FIG. 2 is a plan view illustrating the integrated circuit device of FIG. 1.

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when a layer is referred to as being "on" another layer, it can be directly on the other layer or intervening layers may be present. In contrast, when a layer is referred to as being "directly on" another layer, there are no intervening layers present. Like reference numerals refer to like elements throughout.

It will be understood that although terms such as first, second etc. are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Embodiments of the present invention will be described below with respect to FIGS. 3 through 5. Embodiments of the present invention provide methods of fabricating integrated circuit devices having fuse boxes and integrated circuit devices having the same. A portion of a fuse opening may be etched simultaneously with a via hole of the integrated circuit device and, therefore, decrease the etch time of the fuse opening after a passivation layer is formed. This reduction in etch time during the formation of the fuse opening may provide integrated circuit devices having improved throughput and the capability of resisting moisture due to the presence of a guard ring around a fuse opening. Accordingly, integrated circuits according to embodiments of the present invention may provide improved moisture resistance without sacrificing other device characteristics.

Figure 3A:
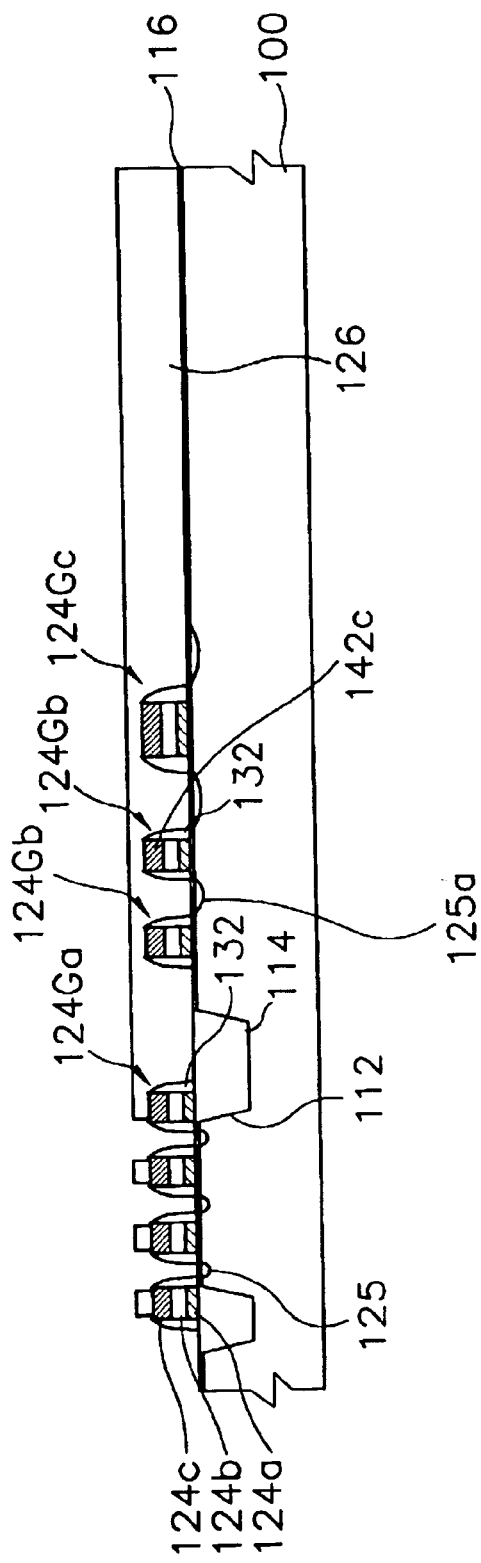

Referring now to FIGS. 3A through 3K, cross sectional views illustrating processing steps in the fabrication of integrated circuit devices having fuse box guard rings according to embodiments of the present invention will be described. As illustrated in FIG. 3A, a substrate 100, for example, of p-type conductivity, is provided. The substrate 100 may include, for example, silicon (Si). An isolation region of the substrate 100 is etched to form a trench 112 in the substrate 100. The trench 112 may have a depth of from about 4,000 to about 5,000 Å and a width of from about 1,000 to about 1,500 Å. An insulating layer, for example, an oxide layer, is formed on the substrate 100 where the trench 112 is formed. The insulator may be formed by hardening a spin on glass (SOG) layer (not shown) after the SOG layer is coated on the substrate 100 using a SOG solution. The SOG layer may have a thickness of from about 6,000 to about 7,000 Å. Furthermore, the insulating layer may be formed on the substrate 100 by a chemical vapor deposition (CVD) process. The obtained insulating layer, for example, a silicon oxide layer, may be polished via a chemical mechanical polishing (CMP) process until a surface of the substrate 100 is exposed. Silicon oxide 114 is formed in the trench 112, thereby forming the isolation region of the substrate 100 as shown in FIG. 3A.

N-type conductivity or p-typed conductivity impurities, for example, phosphorus (P) and/or boron (B), respectively, may be implanted into portions of the substrate 100 corresponding to a region in which a memory cell is formed (a cell array region) and to a peripheral circuit region to provide well regions in the substrate 100. After an exposed surface of the substrate 100 is removed by using a rinsing solution including, for example, hydrofluoric acid (HF), the substrate 100 is oxidized under a wet atmosphere to thereby form a gate oxide film 116 on the surface of the substrate 100. The gate oxide film 116 may have a thickness of from about 40 to about 200 Å.

A first polysilicon layer doped with, for example, n-type conductivity impurities such as phosphorus (P), is formed on the surface of the substrate 100 where the silicon oxide 114 buried in the trench 112 as a field oxide and the gate oxide film 116 are positioned. The first polysilicon layer is formed using, for example, a low pressure chemical vapor deposition (LPCVD) process so that the first polysilicon layer on the substrate 100 has a thickness of from about 500 to about 4,000 Å.

A tungsten silicide film having a thickness of from about 1,000 to about 2,000 Å is formed on the first polysilicon layer using, for example, a CVD or a sputtering process. A silicon nitride film is coated on the tungsten silicide film. The silicon nitride film is formed via an LPCVD process or a plasma enhanced chemical vapor deposition (PECVD) process so that the silicon nitride film has a thickness of from about 500 to about 2,000 Å. A photo resist film is coated on the silicon nitride film. The photo resist film is selectively exposed using a mask. The exposed photo resist film is developed to form photo resist patterns (not shown) for forming gate electrodes. The silicon nitride film, the tungsten silicide film and the first polysilicon layer are successively etched using the photo resist patterns as etching masks, thereby forming gate electrodes 124Ga, 124Gb and 124Gc each of which is composed of, for example, a first polysilicon pattern 124a, a tungsten silicide pattern 124b and a silicon nitride pattern 124c. As illustrated in FIG. 3A, the gate electrodes 124Ga and a word line (not shown) are formed in the cell array region of the substrate 100, and other gate electrodes 124Gb and 124Gc are formed in the peripheral circuit region of the substrate 100.

P-type conductivity and/or n-type conductivity impurities, for example, boron (B) or phosphorus (P), respectively, are implanted into the well regions of the substrate 100 to provide impurity regions 125 in the well regions between the gate electrodes 124Ga, 124Gb and 124Gc. The impurity regions 125 correspond to source and drain regions. Thus, transistors having the gate electrodes 124Ga, 124Gb and 124Gc and the impurities regions 125 are completed.

A silicon nitride film having a thickness of from about 200 to about 600 Å is formed on the substrate 100 by, for example, depositing silicon nitride on the substrate 100 through a CVD process. The silicon nitride film is anisotropically etched to form spacers 132 on sidewalls of the gate electrodes 124Ga, 124Gb and 124Gc.

An oxide film or a silicon nitride film (not shown) having a thickness of from about 100 to about 200 Å is formed on the resultant structure on the substrate 100 by, for example, a CVD process. An oxide layer comprising a material having a good step coverage, for example, BPSG, is formed and re-flowed on the oxide or the silicon nitride film so that the oxide layer has a thickness of from about 4,000 to about 6,000 Å. The oxide layer is polished, for example, using a CMP process to provide a planarized insulation film 126. A photo resist pattern (not shown) for forming bit line contact holes in the cell array region is formed on the planarized insulation film 126. Contact holes are formed in the planarized insulation film 126 to partially expose the impurity regions 125 in the cell array region using the photo resist pattern as an etching mask. Hence, self-aligned bit line contact holes and storage electrode contact holes are formed between the gate electrodes 124Gb in the cell array region. In particular, the self-aligned bit line contact holes are formed to partially expose the drain regions, and the self-aligned storage electrode contact holes are formed to partially expose the source regions.

Figure 3B:
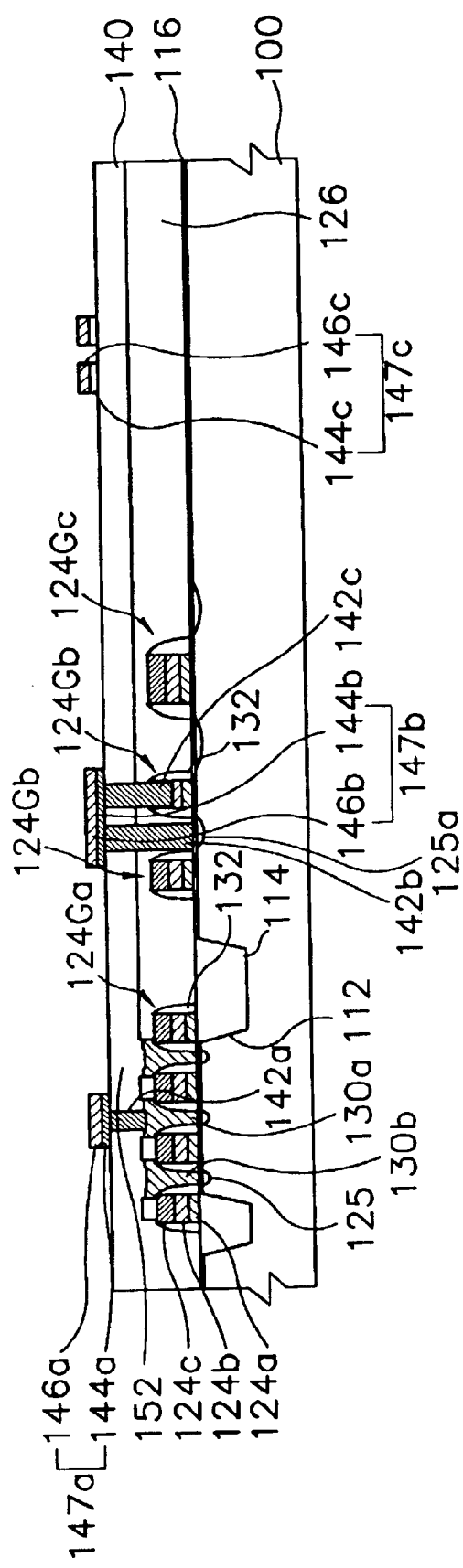

Referring now to FIG. 3B, after forming a second polysilicon layer having a substantial thickness on the resultant structure using, for example, polysilicon doped with impurities and a CVD process, the second polysilicon layer is removed, for example, by a CMP or an etch back process that exposes the planarized insulation film 126. As a result, a bit line contact lower plug 130a and a storage electrode contact lower plug 130b are formed. The bit line contact lower plug 130a and the storage electrode contact lower plug 130b are disposed within the bit line contact hole and the storage electrode contact hole, respectively.

A first interlayer dielectric 140 having a thickness of about 2,000 Å is formed on the resultant structure using, for example, an oxide. A photo resist pattern is formed on the first interlayer dielectric 140 in order to expose the bit line contact lower plug 130a, the drain region 125a and the gate electrode 124Gb in the peripheral circuit region. The first interlayer dielectric 140 is, for example, anisotropically etched to form a contact hole exposing the bit line contact lower plug 130a using, for example, the photo resist pattern as an etching mask. At this time, in the peripheral circuit region, contact holes are formed to expose the drain region 125a and the gate electrode 124Gb because the planarized insulation film 126, which exists beneath the first interlayer dielectric 140, is etched together with the first interlayer dielectric 140.

A metal film, for example, a tungsten film, is formed in the contact holes by, for example, a sputtering process. The tungsten film is planarized by a CMP or an etch back process when the first interlayer dielectric 140 is exposed. As a result, a bit line contact upper plug 142a is formed in the contact hole in the cell array region, and a drain contact plug 142b and a gate electrode contact plug 142c are formed in the contact holes in the peripheral circuit region, respectively.

A conductive layer is formed on the first interlayer dielectric 140 by depositing a conductive material on the first interlayer dielectric 140. The conductive layer may include, for example, polysilicon doped with impurities, a metal such as tungsten, aluminum or titanium, or a metal compound like titanium nitride or tungsten silicide. The conductive layer is patterned, for example, by a photolithography process to form a bit line 147a in the cell array region and to form a peripheral region wiring 147b in the peripheral circuit region. The bit line 147a makes contact with the bit line contact upper plug 142a, and the bit line 147a includes a first polysilicon pattern 144a and a first metal silicide pattern 146a. Furthermore, the peripheral region wiring 147b contacts the drain contact plug 142b and the gate electrode contact plug 142c, and the peripheral region wiring 147b has a second polysilicon pattern 144b and a second metal silicide pattern 146b. In certain embodiments, a fuse line 147c elongated from the bit line 147b is formed at a fuse portion in the peripheral circuit region of the integrated circuit device. The fuse line 147c includes a third polysilicon pattern 144c and a third metal silicide pattern 146c.

Figure 3C:
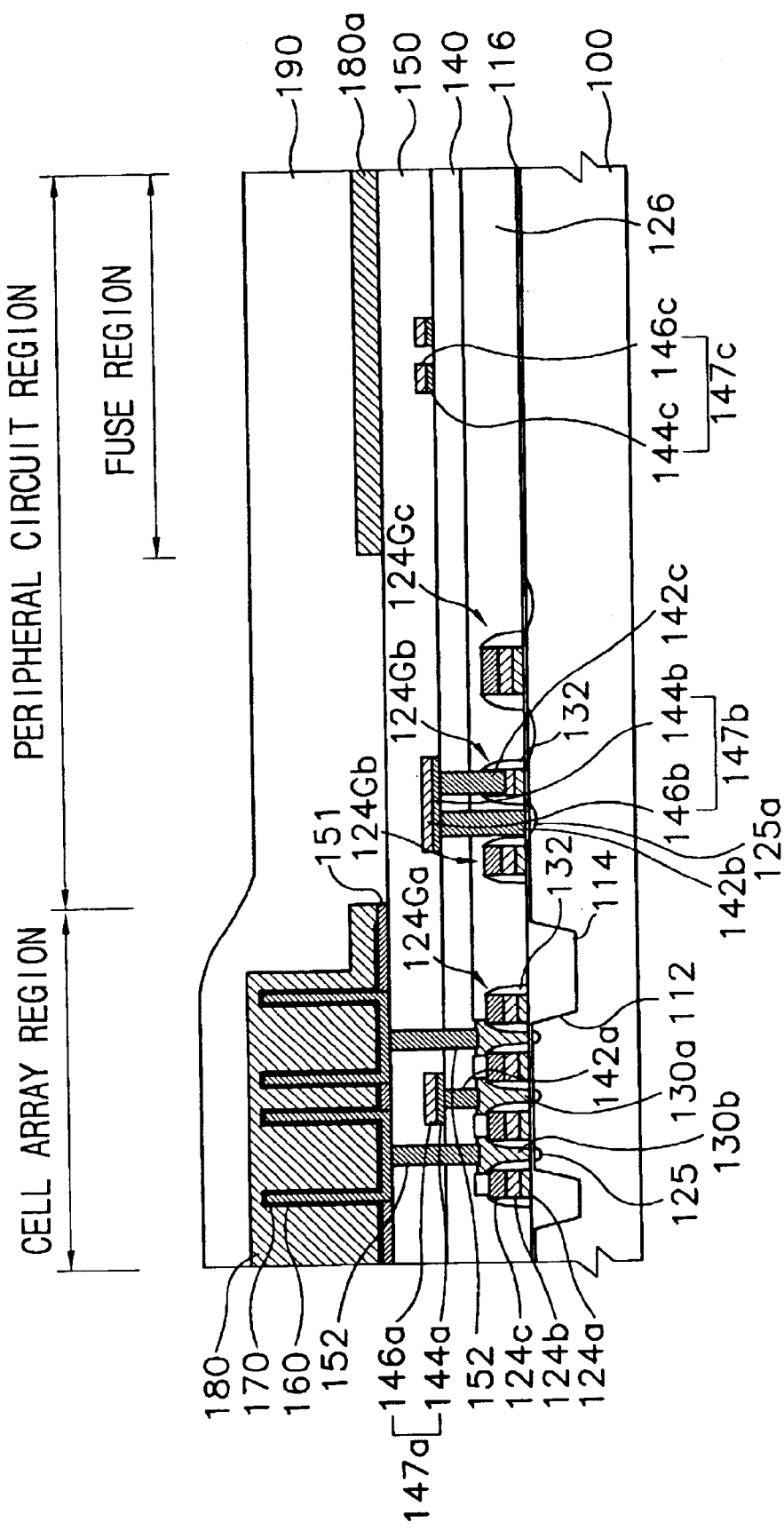

Referring now to FIG. 3C, a BPSG film having a thickness of from about 3,000 to about 5,000 Å is coated on the first interlayer dielectric 140 where the bit line 147a, the wiring 147b in the peripheral region, and the fuse line 147c are formed. The coated BPSG film is re-flowed using a heat treatment. The BPSG film is planarized via a CMP process to form a planarized second interlayer dielectric 150.

A capacitor of the integrated circuit device is formed on the second interlayer dielectric 150 in the cell array region. Before the capacitor is formed, an etch stop film 151 including, for example, nitride, is formed on the planarized second interlayer dielectric 150 in order to reduce the likelihood that the second interlayer dielectric 150 is etched with a sacrificial layer for forming the capacitor. A contact hole exposing the storage electrode contact lower plug 130b is formed in the second interlayer dielectric 150 by, for example, a photolithography process. A first conductive layer (not shown) is formed in the contact hole on the second interlayer dielectric 150. The first conductive layer includes, for example, polysilicon doped with impurities and is formed by, for example, an LPCVD process. The first conductive layer is planarized by a CMP or an etch back process to form a storage electrode contact upper plug 152 in the contact hole, which makes contact with the storage electrode contact lower plug 130b.

A sacrificial layer (not shown) is formed on the storage electrode contact upper plug 152 and on the second interlayer dielectric 150. The sacrificial layer includes, for example, an oxide such as BPSQ PSG or undoped silicate glass (USG). The sacrificial layer is formed over the surface of the substrate 100 where the transistor is positioned using, for example, tetraethyl orthosilicate (TEOS) as a reaction gas so that the sacrificial layer has a thickness of from about 10,000 Å to about 13,000 Å. A photo resist film is coated on the sacrificial layer. The photo resist film is patterned through a photolithography process to form a photo resist pattern for forming a storage electrode. The sacrificial layer and the etch stop film 151 are partially etched using the photo resist pattern as an etching mask, thereby forming an opening, which exposes the storage electrode contact upper plug 152, in the sacrificial layer. In certain embodiments, portions of storage electrode contact upper plug 152 and the second interlayer dielectric 150 adjacent to the storage electrode contact upper plug 152 are exposed through the opening. A second conductive layer is formed on the storage electrode contact upper plug 152, on a sidewall of the sacrificial layer exposed through the opening, and on the surface of the sacrificial layer after the photo resist pattern is removed. The second conductive layer may formed using, for example, polysilicon and an LPCVD process. The second conductive layer may have a thickness of about 500 Å. Typically, each cell has a polysilicon layer wherein one well (or one groove) is formed. The second conductive layer having concave and convex portions may be obtained in accordance with the profile of the well (or the groove).

A hemispherical grain (HSG) silicon film is formed on the second conductive layer, such that, for example, the surface area of the silicon film may be increased when desired. At that time, the HSG silicon film having a thickness of from about 300 to about 500 Å is formed on an inside of the second conductive layer. That is, the HSG silicon film is formed on a bottom face and on a sidewall of the second conductive layer. The HSG silicon film is formed using, for example, $Si_2H_6$ as a reaction gas in a pressure-reduced chemical vapor deposition chamber having a temperature of from about 400 to about 600° C. and a pressure of below about $1 \times 10^{-7}$ Torr or a high vacuum pressure.

A silicon oxide film including, for example, USG, is formed on the second conductive layer as a passivation film by, for example, an LPCVD process. In certain embodiments, the passivation film protects the HSG silicon film and the second conductive layer during an etching process for forming the storage electrode. The passivation film is formed in the well (or the groove) of the second conductive layer, which is a main portion of the second conductive layer, and the passivation film has a relatively planarized upper face.

An etch back process is performed with respect to the passivation film, the second conductive layer, and the HSG silicon film. The etch back process may be executed with, for example, polysilicon etching equipment of a thermo coupled plasma (TCP) type. The passivation film, the second conductive layer, and the HSG silicon film are etched using, for example, a mixture gas comprised of a carbon tetrafluoride gas and a nitrogen gas as an etching gas. With the performance of the etch back process, residues of the passivation film may remain in the well of the second conductive layer, and the second conductive layer on the sacrificial film is etched, thereby forming the storage electrode 160 composed of a cylindrical shaped second conductive layer pattern that is divided into a cell unit. Residues of the passivation film and the sacrificial layer in the well of the storage electrode 160 may be removed by using an etchant for etching silicon oxide, such as buffered oxide etchant (BOE) through a wet etching process. A dielectric film 170 is formed on the storage electrode 160.

A third conductive layer having a thickness of about 2,000 Å is formed over the surface of the substrate 100 to cover the dielectric film 170 using, for example, polysilicon doped with impurities in accordance with the formation of the second conductive layer for forming the storage electrode 160. The third conductive layer is patterned by, for example, a photolithography process to remove portions of the third conductive layer positioned in the peripheral circuit region, thereby forming a plate electrode 180 in the cell array region. In certain embodiments, a polysilicon pattern 180a, which functions as an etch stop film, remains at the fuse portion of the peripheral circuit region while the plate electrode 180 is formed in the cell array region. The polysilicon pattern 180a may function as the etch stop film when an opening of the fuse portion is formed.

A third interlayer dielectric 190 including, for example, BPSG, is formed on the second interlayer dielectric 150 where the plate electrode 180 and the polysilicon pattern 180a are formed. The third interlayer dielectric 190 having a thickness of from about 17,000 to about 29,000 Å is planarized by, for example, a CMP process or an etch back process.

Figure 3D:
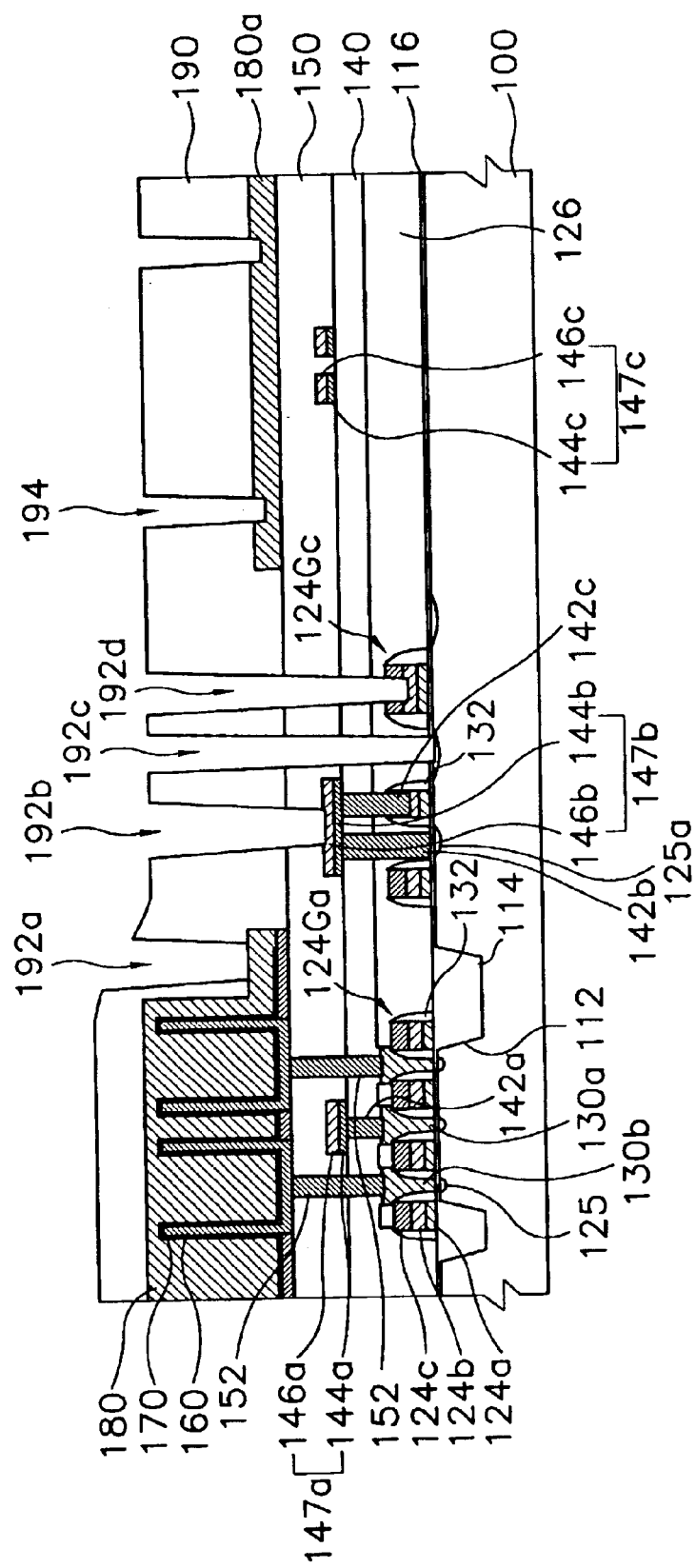

Referring now to FIG. 3D, photo resist patterns are formed on the third interlayer dielectric 190 in order to form contact holes for connecting wirings to device elements positioned below the third interlayer dielectric 190. The third interlayer dielectric 190, the second interlayer dielectric 150 and the first interlayer dielectric 140 are partially anisotropically etched by using the photo resist patterns as etching masks. As a result, a plate contact hole 192a for connecting wirings to the plate electrode 180, and peripheral circuit contact holes 192b, 192c and 192d for connecting wirings to device elements positioned in the peripheral circuit region are formed. At this time, a first fuse contact hole 194 exposing the polysilicon pattern 180a is formed at the fuse portion of the peripheral circuit region. The first fuse contact hole 194 encloses the fuse line 147c in, for example, a rectangular shape.

Referring now to FIG. 3E, a barrier layer (not shown) having a relatively thin thickness is formed on the resultant structure. The barrier layer may include, for example, a refractory metal, a refractory metal compound, and/or a mixture of a refractory metal and a refractory metal compound such as titanium, tantalum, titanium nitride or tantalum nitride. A first tungsten layer is formed in the plate contact hole 192a and peripheral circuit contact holes 192b, 192c and 192d by, for example, a sputtering process. The first tungsten layer is etch backed until the third interlayer dielectric 190 is at least partially exposed to provide a plate contact plug 196a in the plate contact hole 192a, peripheral contact plugs 196b, 196c and 196d in the peripheral circuit contact holes 192b, 192c and 192d, and a first fuse contact plug 198 disposed in the first fuse contact hole 194.

Figure 3F:
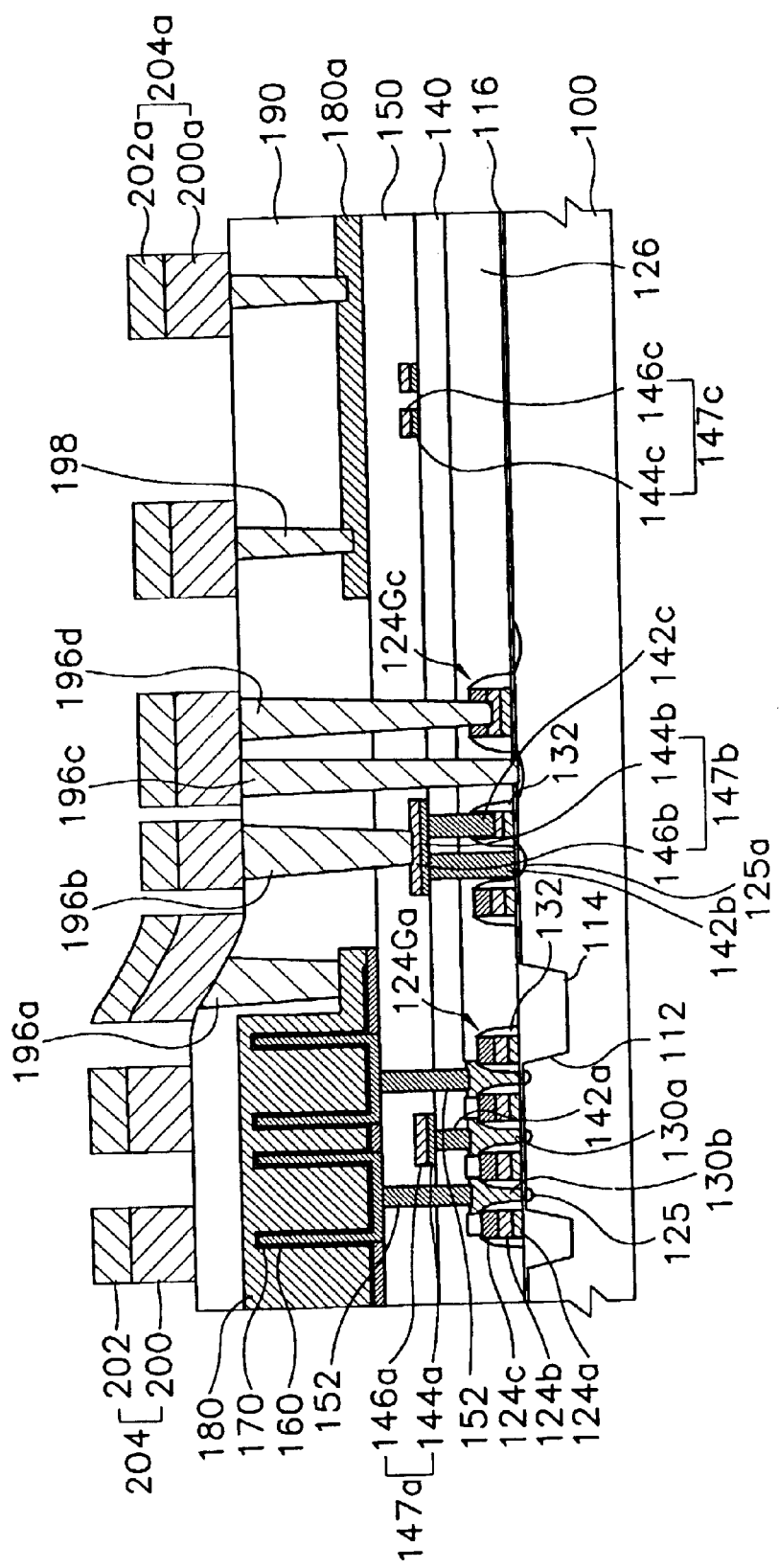

Referring now to FIG. 3F, a first metal layer having a thickness of about 4,000 Å is formed on the third interlayer dielectric 190 to make contact with the plate contact plug 196a, the peripheral circuit contact plugs 196b, 196c and 196d, and the first fuse contact plug 198. The first metal layer may include, for example, aluminum, tungsten or titanium, and may be formed by, for example, a sputtering or a CVD process. In certain embodiments, the first metal layer includes aluminum and a first metal compound layer of, for example, titanium nitride, having a thickness of about 1,000 Å is formed on the first metal layer.

A photo resist pattern for forming a first wiring 204 of the integrated circuit device is formed on the first metal compound layer. The first metal compound layer is patterned using, for example, the photo resist pattern as an etching mask, to provide the first wiring 204 including a first metal layer pattern 200 and a first metal compound layer pattern 202 in the cell array region. The first wiring 204 makes contact with the plate contact plug 196a and peripheral circuit contact plugs 196b, 196c and 196d. Thus, the first wiring 204 transfers electrical signals to integrated circuit devices. At the same time, a lower guard ring pattern 204a having, for example, a rectangular shape, is formed at the fuse portion in the peripheral circuit region. The lower guard ring pattern 204a includes a first metal layer pattern 200a and a first metal compound layer pattern 202a, which makes contact with the first fuse contact plug 198.

Referring now to FIG. 3G, a fourth interlayer dielectric 210 having a thickness of about 7,000 Å is formed on the third interlayer dielectric 190 where the first wiring 204 and the lower guard ring pattern 204a are positioned. The fourth interlayer dielectric 210 includes, for example, an oxide including TEOS oxide, spin-on glass (SOG) or flowable oxide (FOX).

Figure 3H:
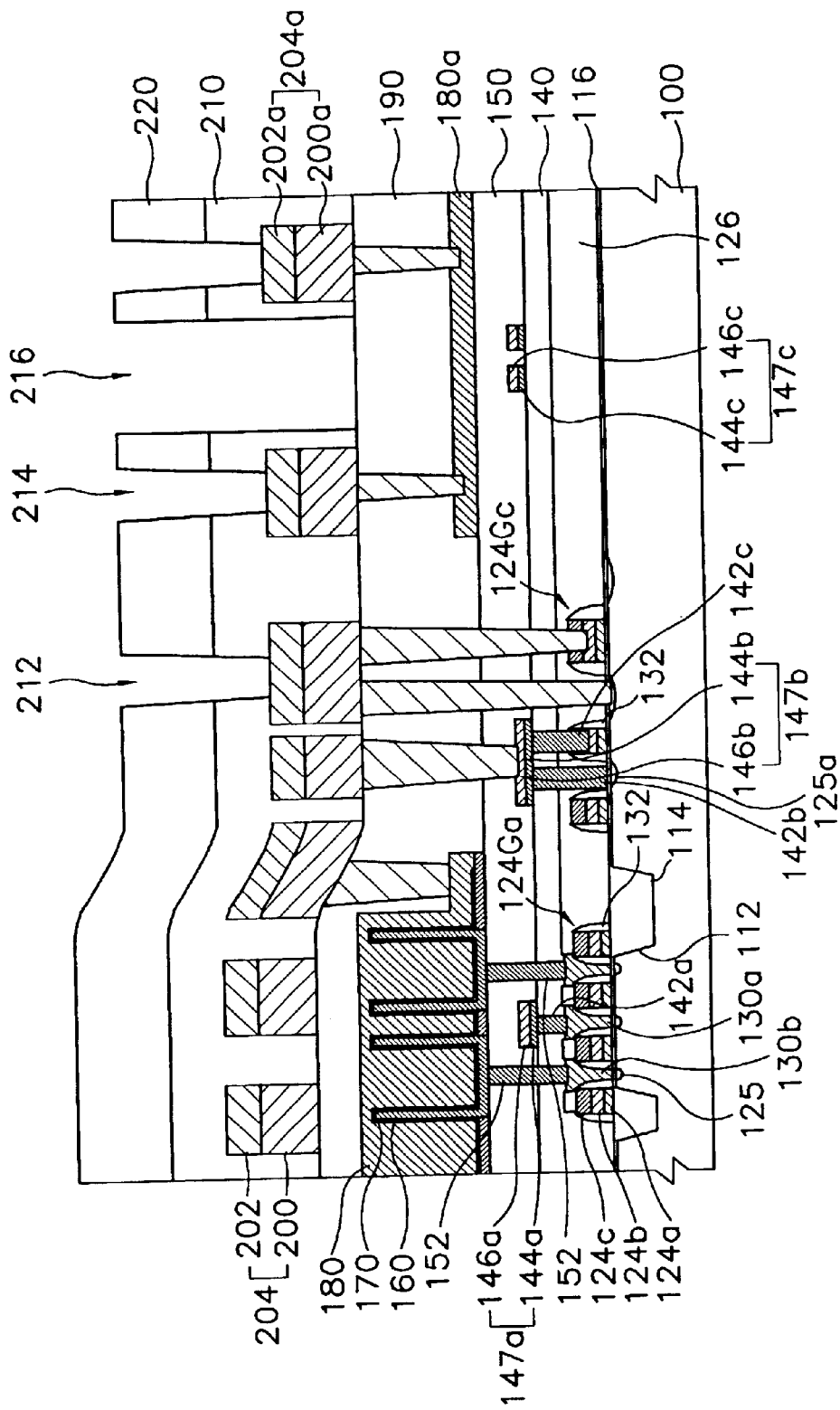
Figure 31:
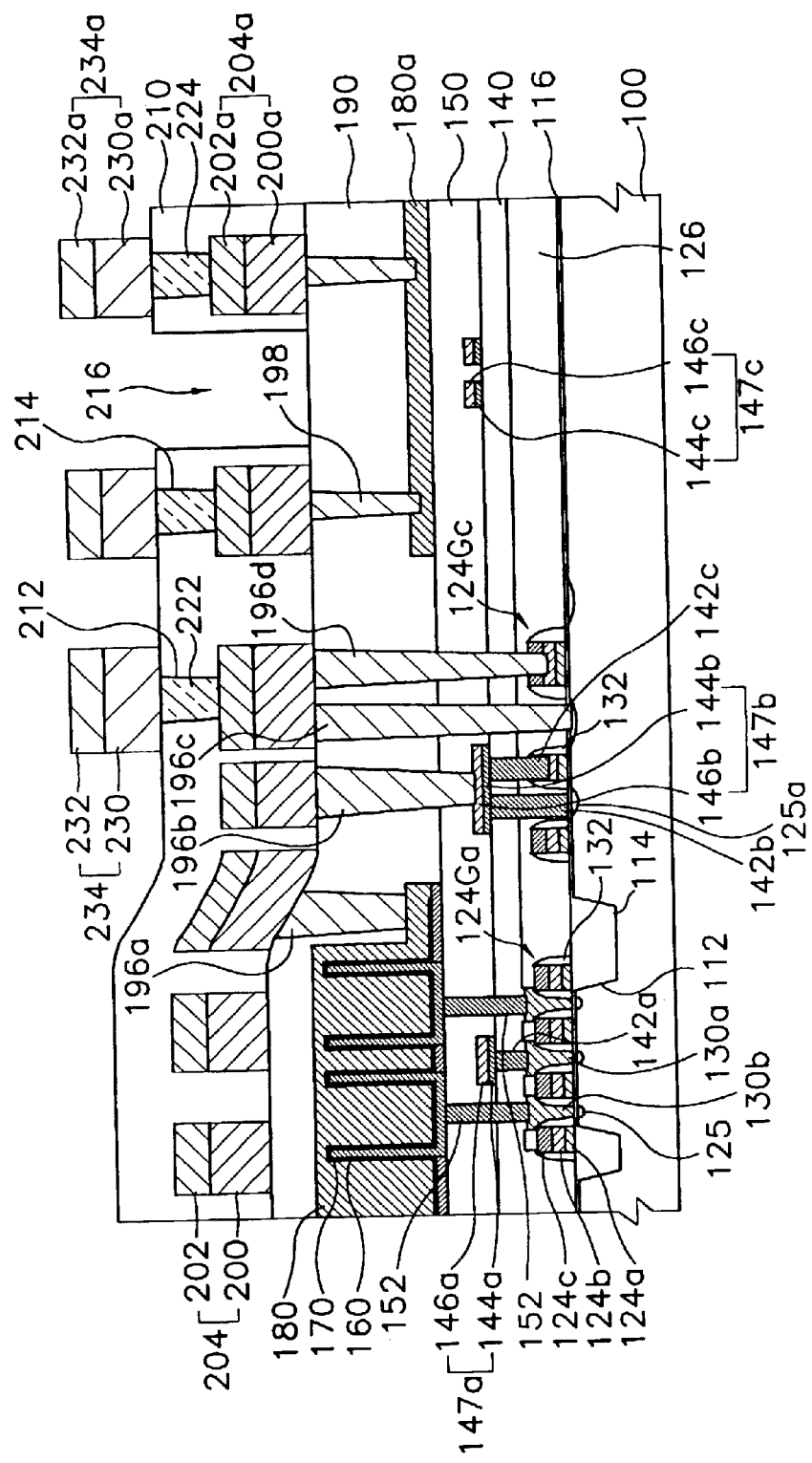

Referring now to FIG. 3H, a photo resist film is formed on the fourth interlayer dielectric 210 and a photo resist pattern 220 is formed, for example, by patterning the photo resist film through an exposure process and a development process in order to form a second fuse contact hole and a central groove 216. The fourth interlayer dielectric 210 is anisotropically etched using the photo resist pattern 220 as an etching mask to provide a via hole 212 connected to a second wiring for applying signals to the first wiring 204. In certain embodiments, a second fuse contact hole 214 is formed at the fuse portion in the peripheral circuit region to partially expose the lower guard ring pattern 204a. In addition, the central groove 216 may be formed by etching a portion of the fourth interlayer dielectric 210 positioned in a central region located over the fuse and enclosed by the lower guard ring pattern 204a. The fourth interlayer dielectric 210 may be etched until the first wring 204 and the lower guard ring pattern 204a are exposed. The fourth interlayer dielectric 210 may be somewhat over etched in order to accurately control the etching process. In certain embodiments, a recess may be formed by partially etching the third interlayer dielectric 190 beneath the fourth interlayer dielectric 210.

Referring now to FIG. 3I, the remaining photo resist pattern 220 on the fourth interlayer dielectric 210 is removed by, for example, a stripping process. A second tungsten layer is formed by, for example, a sputtering process, in accordance with the formations of the plate contact plug 196a, the peripheral circuit contact plugs 196b, 196c and 196d, and the first fuse contact plug 198. The second tungsten layer is formed in the via hole 212 and the second fuse contact hole 214. The second tungsten layer is etched by, for example, an etch back process, until the fourth interlayer dielectric 210 is exposed to provide a via contact plug 222 disposed in the via hole 212, and a second fuse contact plug 224 disposed in the second fuse contact hole 214.

A second metal layer (not shown) is formed on the surface of the fourth interlayer dielectric 210 in accordance with the formation of the first wiring 204. The second metal layer makes contact with the via contact plug 222 and the second fuse contact plug 224. The second metal layer may have a thickness of about 6,000 Å and may include, for example, aluminum, tungsten or titanium. The second metal layer is formed by, for example, a sputtering or a CVD process. In certain embodiments, the second metal layer includes aluminum and a second metal compound layer (not shown) is formed on the second metal layer. The second metal compound layer may have a thickness of about 300 Å and may include titanium nitride.

A photo resist pattern is formed on the second metal compound layer to provide a second wiring 234 of the integrated circuit device, the second wiring 234 is formed in the cell array region by using the photo resist pattern as an etching mask. The second wiring 234 includes a second metal layer pattern 230 and the second metal compound layer pattern 232. The second wiring 234 applies electric signals from outside to the first wiring 204. An upper guard ring pattern 234a having, for example, a rectangular shape is simultaneously formed in the fuse portion of the peripheral circuit region. The upper guard ring pattern 234a includes a second metal layer pattern 230a and a second metal compound layer pattern 232a, and the upper guard ring pattern 234a makes contact with the second fuse contact plug 224. The completed first and second guard rings of the fuse box include the first fuse contact plug 198, the lower guard ring pattern 204a, the second contact plug 224, and the upper guard ring pattern 234a.

Figure 3K:
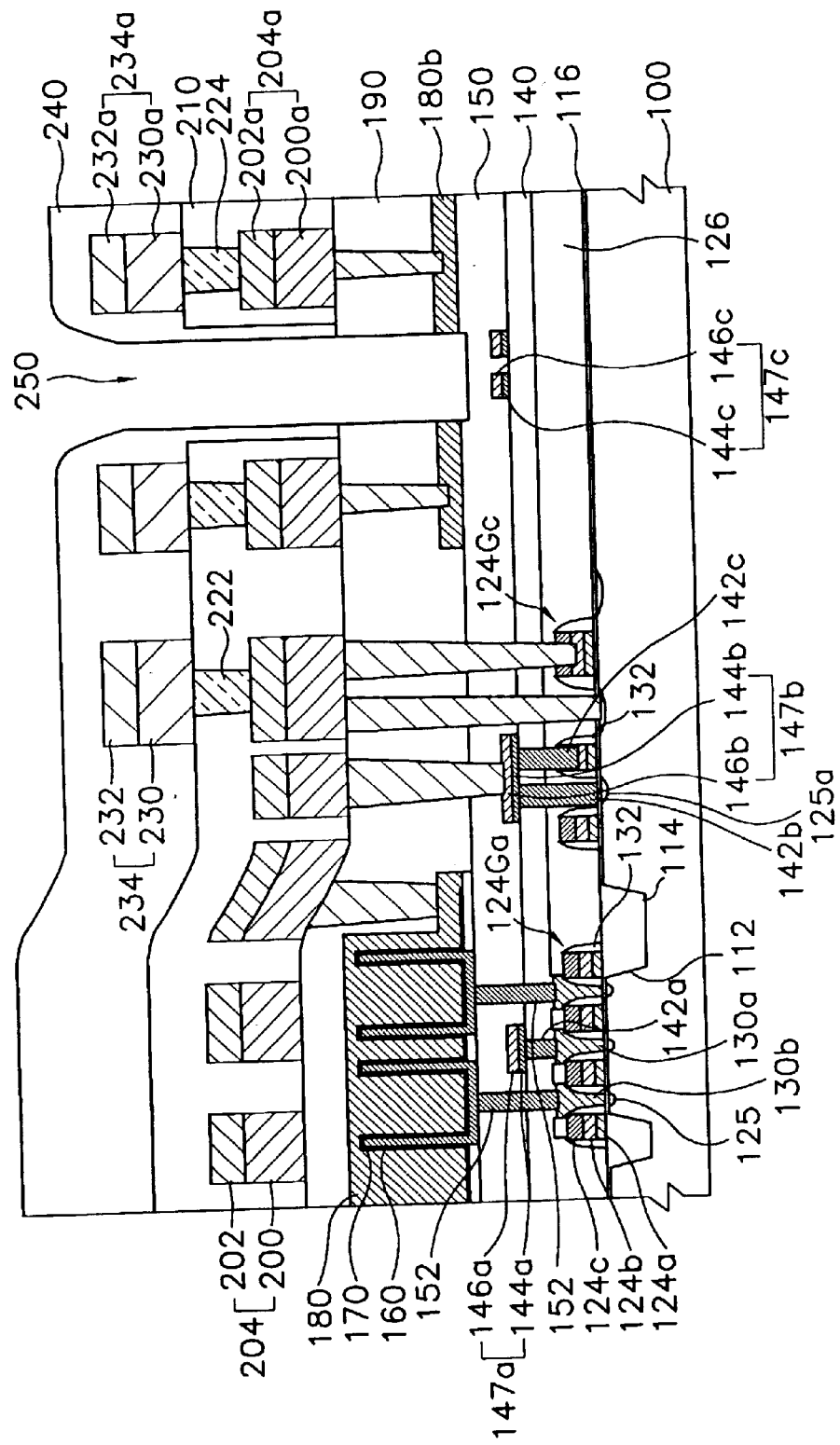

Referring now to FIG. 3J, a passivation layer 240 is formed on the surface of the resultant structure on the substrate 100 to cover the second wiring 234 and the upper guard ring pattern 234a. As illustrated in FIG. 3K, a fuse opening 250 is formed by partially etching the passivation layer 240 and the third interlayer dielectric 190 positioned on the fuse line 147c and enclosed by the upper guard ring pattern 234a using, for example, a photolithography process. The etching process continues until the etch stop polysilicon pattern 180a positioned over the fuse line 147c is etched through. An end point of the etching process for forming the fuse opening 250 can be easily detected using the polysilicon pattern 180a. After the etch, the polysilicon pattern 180b enclosing the fuse portion is formed.

According to embodiments of the present invention described above with respect to FIGS. 3A through 3K, the fourth interlayer dielectric 210 is partially etched to form the central groove 216 at the same time that the via hole 212 is formed in the fourth interlayer dielectric 210. This process may reduce the etch time during the formation of the fuse opening 250 and, therefore, improve the throughput for the integrated circuit device.

Figure 4:
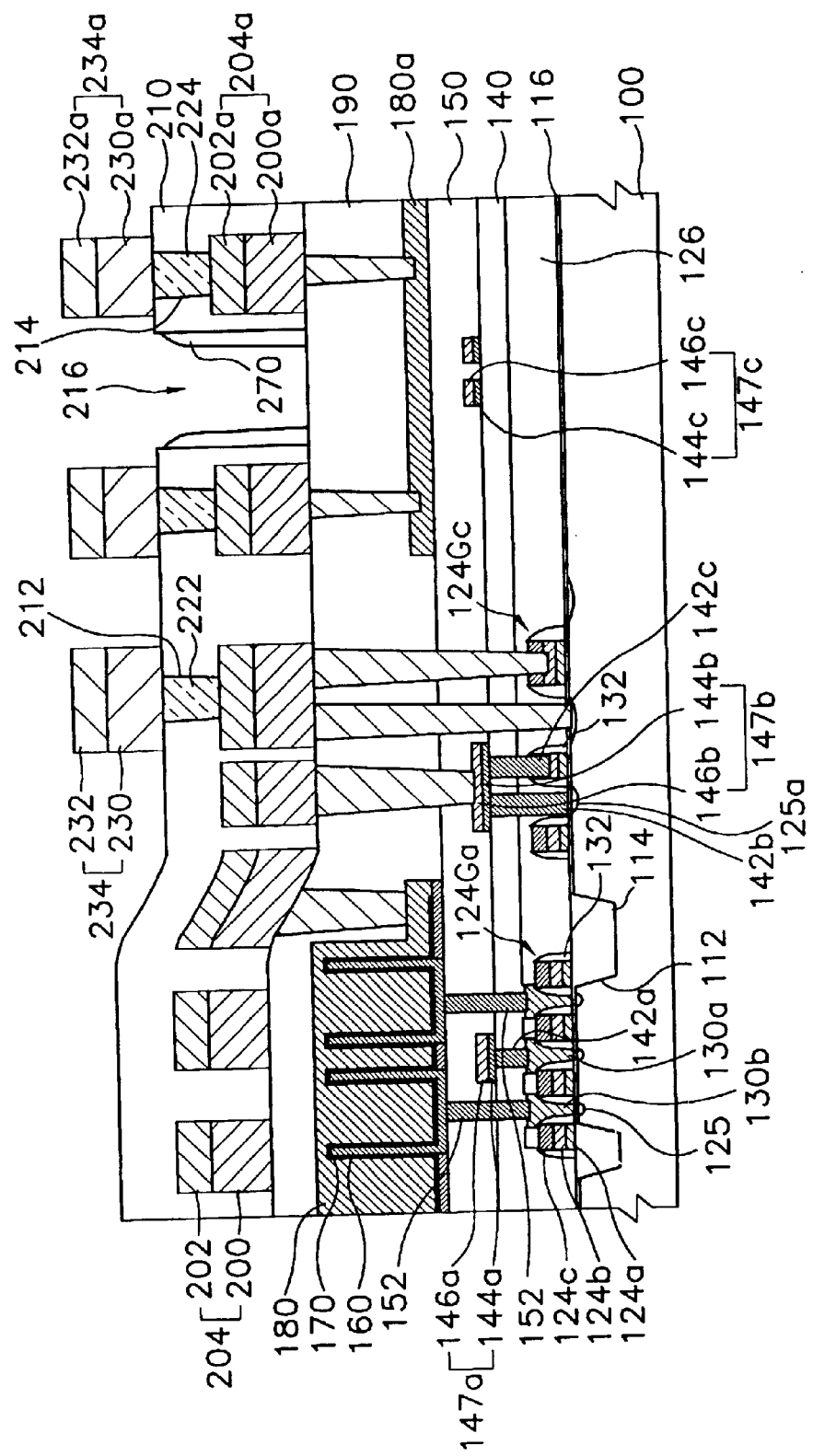
FIG. 4 is a cross sectional view illustrating integrated circuits having fuse box guard rings according to embodiments of the present invention illustrated in FIGS. 3A through 3K.

Referring now to FIG. 4, metal residues 270 may remain in a central groove 216 of a fourth interlayer dielectric 210 when a second wiring is formed. After the processing steps described with respect to FIG. 3I above, a via contact plug 222 is formed in the via hole 212 and a second fuse contact plug 224 is formed in the second fuse contact hole 214. A second metal layer (not shown) and a second metal compound layer, which have a thickness of about 6,000 Å, are formed to contact with the via contact plug 222 and the second fuse contact plug 224. The second metal and the second metal compound layers include, for example, aluminum, tungsten or titanium, and are formed by, for example, a sputtering or a CVD process. In certain embodiments, the second metal and the metal compound layers are successively formed on a sidewall of the central groove 216.

A photo resist pattern is formed on the second metal compound layer in order to form a second wiring of the integrated circuit device, and then the second metal and the second metal compound layers are etched by using the photo resist pattern as an etching mask. Portions of the second metal layer may partially remain on the sidewall of the central groove 216 because the etching is anisotropically performed against the second metal and the second metal compound layers. Those residues of the metal layer may cause the formation of impurities during the integrated circuit manufacturing process.

Embodiments of the present invention illustrated in FIGS. 5A through 5D may address the presence of residues discussed above with respect to FIG. 4. FIGS. 5A through 5D are cross sectional views illustrating processing steps in the fabrication of integrated circuits having fuse box guard rings according to further embodiments of the present invention. Like numbers refer to like elements throughout, thus, in the interest of brevity elements described above will not be described in detail with respect to FIGS. 5A through 5D.

Figure 5A:
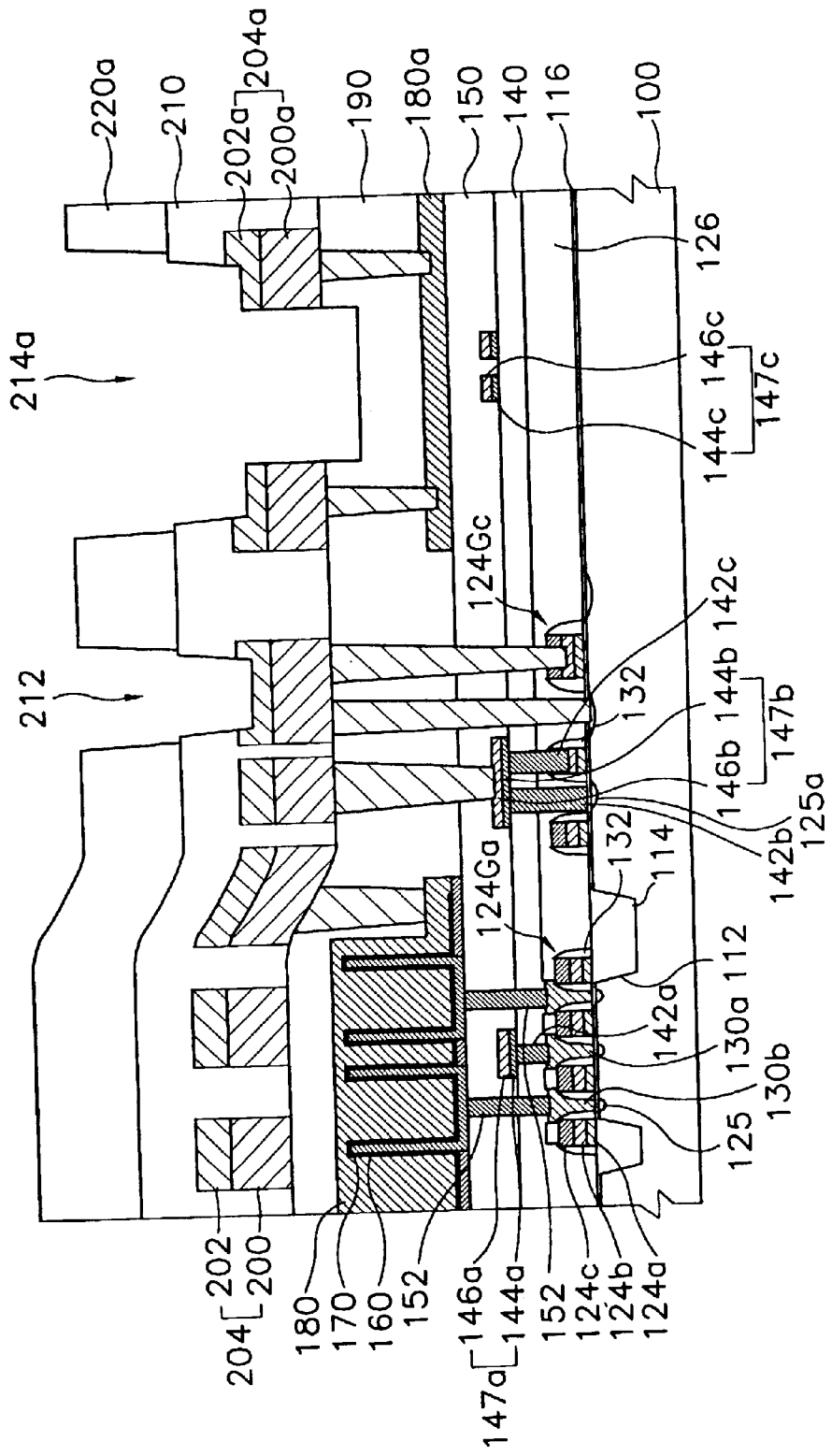

Referring now to FIG. 5A, after a photo resist film is formed on the fourth interlayer dielectric 210 in FIG. 3G, a photo resist pattern 220a for forming an opening is formed by, for example, exposing and developing the photo resist film. The opening exposes the first wiring 204, the lower guard ring pattern 204a, and the fuse portion. The fourth interlayer dielectric 210 is, for example, anisotropically etched, using the photo resist pattern 220a as an etching mask to provide the via hole 212 in order to apply signals to the first wiring 204 from outside. In certain embodiments, a portion of the fourth interlayer dielectric 210 defined by the lower guard ring pattern 204a, is removed to form a preliminary fuse opening 214a that partially exposes the third interlayer dielectric 190 at the fuse portion in the peripheral circuit region. The etching process is performed until the first wiring 204 and the lower guard ring pattern 204a are exposed, the fourth interlayer dielectric 210 may be somewhat over etched so as to precisely control the etching degree. In some embodiments, the third interlayer dielectric 190 positioned beneath the fourth interlayer dielectric 210 is partially etched to form a recess.

Referring now to FIG. 5B, the remaining photo resist pattern 220a on the fourth interlayer dielectric 210 is removed by, for example, a stripping process. A second metal layer 300 having a thickness of about 6,000 Å is formed on the surface of the fourth interlayer dielectric 210 by, for example, a sputtering or a CVD process. The second metal layer 300 may include, for example, aluminum, tungsten or titanium, and is successively formed on inner surfaces of the via hole 212 and the preliminary opening 214a. In certain embodiments, the second metal layer 300 includes aluminum. A second metal compound layer 302 including, for example, titanium nitride, and having a thickness of about 300 Å is formed on the second metal layer 300. A photo resist pattern 304 for the second wiring of the integrated circuit device is formed on the second metal compound layer 302. The photo resist pattern 304 is located on a central portion of the preliminary opening 214a, and partially exposes the second metal compound layer 302 over the fuse line 147c.

Figure 5C:
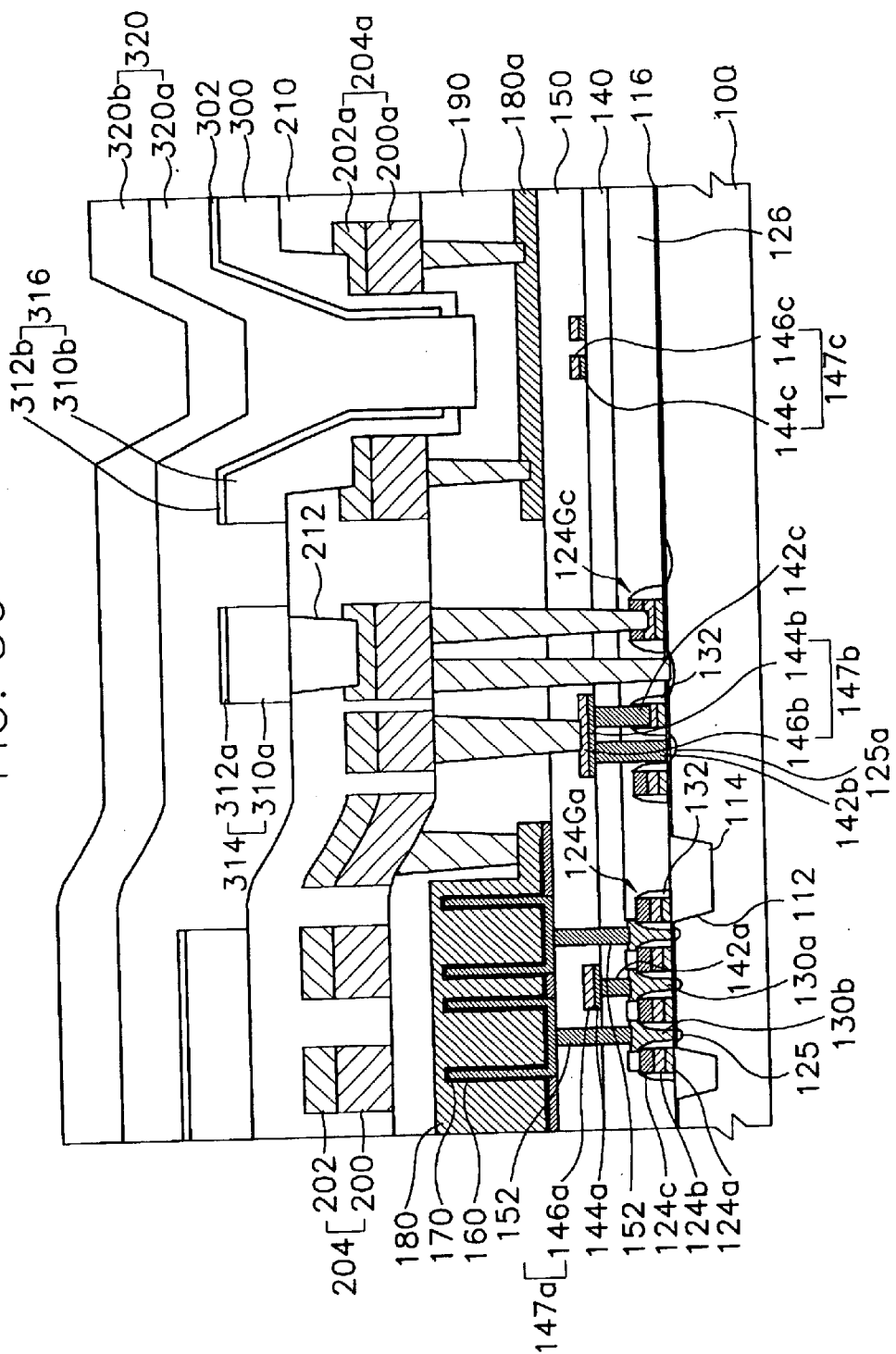

Referring now to FIG. 5C, the second metal compound and the second metal layers 302 and 300, respectively, are successively anisotropically etched by using the photo resist pattern 304 as an etching mask to provide the second wiring 314 including a second metal layer pattern 310a and a second metal compound layer pattern 312a in the cell array region. The second metal layer pattern 310a is formed in the via hole 212, and the second metal compound layer pattern 312a is formed on the second metal layer pattern 310a. An upper guard ring pattern 316 is simultaneously formed at the fuse portion in the peripheral circuit region. The upper guard ring pattern 316 includes a second metal layer pattern 310b and a second metal compound layer pattern 312b.

A passivation layer 320 including a first passivation film 320a and a second passivation film 320b is formed on the resultant structure. The first passivation film 320a may include, for example, silicon oxide, such as high density plasma (HDP) oxide, and the second passivation film 320b may include, for example, silicon nitride. The first passivation film 320a having a thickness of about 1 $\mu$m is formed in a space between the second metal layer patterns 310a, and the second passivation film 320b having a thickness of about 5,000 Å. The first passivation film 320a may reduce the amount of moisture that permeates into the integrated circuit.

Figure 5D:
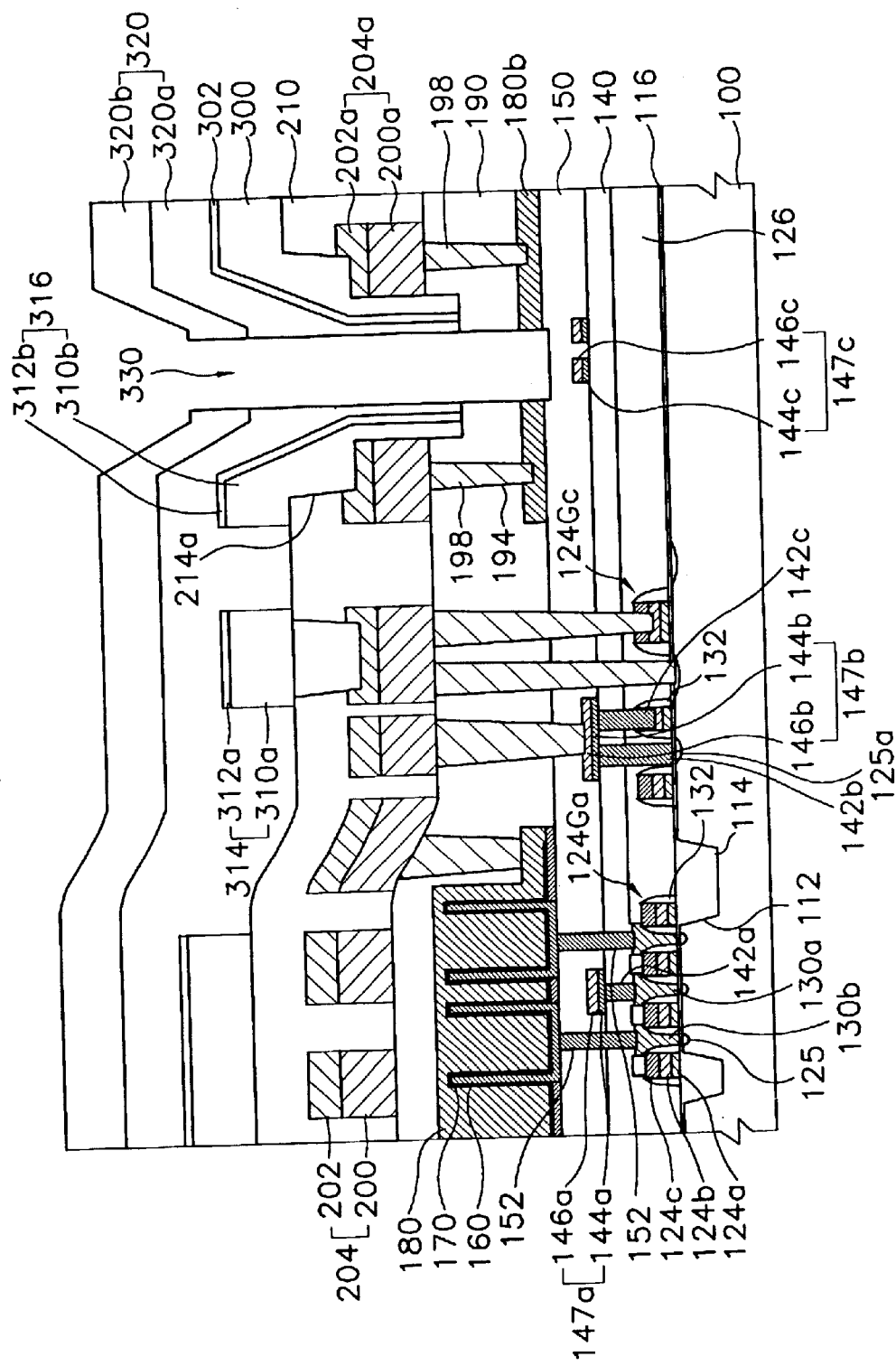

Referring now to FIG. 5D, a fuse opening 330 is formed by, for example, anisotropically etching the passivation layer 320, the third interlayer dielectric 190, and the polysilicon pattern 180a at the fuse portion using, for example, a photolithography process. The etching process is performed until the polysilicon pattern 180a on the fuse line 147c is removed. Hence, using the polysilicon pattern 180a as an etch stop layer, the end point of the etching process can be detected during the formation of the fuse opening 330. As a result, the central portion of the polysilicon pattern 180a is removed during the etching process, providing a polysilicon pattern 180b for the fuse, which is prolonged from the fuse opening 330, which is formed on the fuse line 147c to enclose the fuse line 147c.

The cell portion of the device illustrated in FIG. 5D is similar to the cell portion of the device illustrated in FIGS. 3A through 3K, therefore, further description of the cell portion of the device will be omitted. As illustrated in FIG. 5D, the fuse box of the integrated circuit device has the fuse line 147c formed on the first interlayer dielectric 140. The fuse line 147c is simultaneously formed with the bit line 147a in the cell array region. The second interlayer dielectric 150 is formed on the first interlayer dielectric 140 to cover the fuse line 147c. The polysilicon pattern 180b including the opening prolonged from the fuse opening 330 over the fuse line 147c is formed on the second interlayer dielectric 150. The polysilicon pattern 180b encloses the fuse line 147c on the same plane, and the polysilicon pattern 180b is simultaneously formed with the plate electrode 180 in the cell array region. The third interlayer dielectric 190 is formed on the polysilicon pattern 180b.

The fuse contact hole 194 enclosing the fuse line 147c and the fuse opening 330 is formed in the third interlayer dielectric 190, and partially exposes the polysilicon pattern 180b. As illustrated in FIG. 3D, the fuse contact hole 194 is simultaneously formed with the plate electrode contact hole 192a in the cell array region, and the contact holes 192a, 192c and 192d in the peripheral circuit region. The metal plug 198 includes, for example, tungsten or aluminum, and is formed in the fuse contact hole 194. The metal plug 198 is simultaneously formed with the plate electrode contact plug 196a, and the contact plugs 196b, 196c and 196d as illustrated in FIG. 3E.

The lower guard ring pattern 204a is provided on the metal plug 198 and on the third interlayer dielectric 190 adjacent to the metal plug 198 so that the lower guard ring pattern 204a encloses the fuse portion including the fuse line 147c and the fuse opening 330. The lower guard ring pattern 204a has a first metal layer pattern 200a and a first metal compound layer pattern 202a. The first metal layer pattern 200a includes, for example, aluminum, tungsten or titanium, and the first metal compound layer pattern 202a includes, for example, titanium nitride. The lower guard ring pattern 204a is simultaneously formed with the first wiring 204 in the cell array and the peripheral circuit regions.

The fourth interlayer dielectric 210 is formed on the third interlayer dielectric 190. The fourth interlayer dielectric 210 has the opening 214a (FIG. 5A) that exposes the fuse portion and a portion of the lower guard ring pattern 204a. The opening 214a is simultaneously formed with the via hole 212. The fuse portion may be partially over etched so that the opening 214a may be prolonged from the sidewall of the lower guard ring pattern 204a in a downward direction. The third interlayer dielectric 190 over the fuse line 147c is partially removed, thereby forming a recess on the third interlayer dielectric 190.

An upper guard ring pattern 316 is formed on the fourth interlayer dielectric 210 adjacent to the opening 214a. In particular, the upper guard ring pattern 316 is successively formed on the sidewalls of the opening 214a, on the exposed lower guard ring pattern 204a and on the inside of the lower guard ring pattern 204a. When the opening 214a is prolonged from the lower guard ring pattern 204a to form the recess on the third interlayer dielectric 190, the upper guard ring pattern 316 is prolonged to inside of the recess. The upper guard ring pattern 316 includes a second metal layer pattern 310a and a second metal compound layer pattern 312b similar to the first metal layer pattern 200a and the first metal compound layer pattern 202a of the lower guard ring pattern 204a. The upper guard ring pattern 316 is simultaneously formed with the second wiring 314.

A passivation layer 330 is formed on the fourth interlayer dielectric 210 to cover the upper guard ring pattern 316. A fuse opening 330 is formed in the passivation layer 330 that exposes the second interlayer dielectric 150 on the fuse line 147c. The fuse opening 330 has a size smaller than an area defined by the lower guard ring pattern 204a.

Accordingly, a portion of the fourth interlayer dielectric 210 is removed in the fuse portion when the via hole 212 is formed in the fourth interlayer dielectric 210. Due to the formation of the second metal layer 200a and the second metal compound layer 202a illustrated in FIG. 5D, metal residues 270 as illustrated in FIG. 4 may be reduced in the opening 214a, thus, possibly increasing the yield of the integrated circuit fabrication process. Furthermore, the fourth interlayer dielectric 210 is removed in the fuse portion during the formation of the via hole 212, thus, possibly increasing the throughput of the device due to a decrease in etching time during formation of the fuse opening 330 as discussed above.

As described above with respect to FIGS. 3 through 5, an interlayer dielectric over a fuse portion may be partially etched simultaneously with a via hole of the integrated circuit device, therefore, decreasing the etch time during the formation of the fuse opening of the integrated circuit device. This decrease in etch time may increase throughput of the integrated circuit device. In further embodiments of the present invention, the presence of metal residues on sidewalls of the fuse opening of the integrated circuit may be reduced. The reduction of these metal residues may enhance the yield of the integrated circuit device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating an integrated circuit device, comprising:
   forming a fuse line at a fuse portion of the integrated circuit device;
   forming a first insulating layer on the fuse line;
   forming a guard ring pattern on the first insulating layer, the guard ring pattern being formed to enclose the fuse line;
   forming a second insulating layer on the guard ring pattern and the first insulating layer;
   partially etching the second insulating layer to remove a portion of the second insulating layer in the fuse portion of the integrated circuit device enclosed by the guard ring pattern exposing a portion of the first insulating layer and to form a via hole outside the fuse portion of the integrated circuit device.
   forming an etch stop layer between the fuse line and the first insulating layer; and
   forming a fuse contact hole in the first insulating layer that partially exposes the etch stop layer and encloses the fuse line.

2. A method of fabricating an integrated circuit device, comprising:
   forming a fuse line at a fuse portion of the integrated circuit device;
   forming a first insulating layer on the fuse line;
   forming a guard ring pattern on the first insulating layer, the guard ring pattern being formed to enclose the fuse line;
   forming a second insulating layer on the guard ring pattern and the first insulating layer;
   partially etching the second insulating layer to remove a portion of the second insulating layer in the fuse portion of the integrated circuit device enclosed by the guard ring pattern exposing a portion of the first insulating layer and to form a via hole outside the fuse portion of the integrated circuit device.
   forming an etch stop layer between the fuse line and the first insulating layer;
   forming a fuse contact hole in the first insulating layer that partially exposes the etch stop layer and encloses the fuse line; and
   forming a fuse contact plug in the fuse contact hole, wherein the guard ring pattern is formed on the fuse contact plug.

3. The method of claim 2, wherein partially etching the second insulating layer further comprises partially etching the second insulating layer to form a second fuse contact hole that exposes the guard ring pattern and encloses the fuse line.

4. The method of claim 3, wherein the guard ring pattern is a first guard ring pattern, wherein the fuse contact hole is a first fuse contact hole and the fuse contact plug is a first fuse contact plug, the method further comprising:
   forming a second fuse contact plug in the second fuse contact hole;
   forming a second guard ring pattern on the second fuse contact that encloses the fuse line;
   forming a passivation layer on the integrated circuit device; and
   forming a fuse opening in a portion of the integrated circuit device enclosed by the first and second guard ring patterns by etching through the passivation layer, the first insulating layer and the etch stop layer.

5. The method of claim 4, wherein forming a passivation layer comprises forming a passivation layer on the first and second guard ring patterns, the second insulating layer and on the portion first insulating layer exposed by removing a portion of the second insulating layer.

6. The method of claim 4, wherein the method further comprises:
   forming an integrated circuit substrate; and
   forming a third insulating layer on the integrated circuit substrate, wherein the fuse line comprises a first layer of polysilicon on the third insulating layer and a second layer of metal silicide on the first layer of polysilicon.

7. The method of claim 4:
   wherein forming the first guard ring pattern comprises forming a first metal layer on the first contact plug and forming a first metal compound layer on the first metal layer; and
   wherein the second guard ring pattern comprises forming a second metal layer on the second contact plug and a second metal compound layer on the second metal layer.

8. The method of claim 7, wherein forming the first guard ring pattern comprises forming a first guard ring pattern having a rectangular shape that encloses the fuse line and wherein forming the second guard ring pattern comprises forming a second guard ring pattern having a rectangular shape that encloses the fuse line.

9. The method of claim 7, wherein the first and second metal layers comprise aluminum and the first and second metal compound layers comprises titanium nitride.

10. The method of claim 1, wherein the guard ring pattern comprises a first guard ring pattern, the method further comprising:
    forming an etch stop layer between the fuse line and the first insulating layer;
    forming a metal layer on a surface of the integrated circuit device;
    forming a compound metal layer on the metal layer;
    etching the metal layer and the metal compound layer to form a second guard ring pattern that encloses the fuse line on the first guard ring pattern;

forming a passivation layer on the surface of the integrated circuit device; and forming a fuse opening in a portion of the integrated circuit device enclosed by the first and second guard ring patterns by etching through the passivation layer, the first insulating layer and the etch stop layer.

11. The method of claim 10, wherein the passivation layer comprises a first passivation film on the surface of the integrated circuit device and a second passivation film on the first passivation film and wherein forming a fuse opening further comprises etching through the first and second passivation films.

12. A method for manufacturing an integrated circuit device comprising the steps of:

forming a first interlayer dielectric on a fuse portion where a fuse wiring of the integrated circuit device is formed, the first interlayer dielectric having a first metal plug enclosing the fuse portion;

forming a first metal layer pattern on the first metal plug;

forming a second interlayer dielectric on the first interlayer dielectric to cover the first metal layer pattern;

forming a first opening and a second opening in the second interlayer dielectric wherein the first opening encloses the fuse portion to expose the first metal layer pattern, and the second opening exposes the first interlayer dielectric at the fuse portion;

forming a second metal plug in the first opening;

forming a second metal layer pattern on the second metal plug wherein the second metal layer pattern encloses the fuse portion; and forming an etch stop film at the fuse portion to cover the fuse portion before the second interlayer dielectric is formed, the first metal plug contacting the etch stop film.

13. The method for manufacturing an integrated circuit device according to claim 12, further comprising the steps of:

forming a passivation layer on the second interlayer dielectric to cover the exposed first interlayer dielectric and the second metal layer pattern; and forming a fuse opening by successively etching the passivation layer and the first interlayer dielectric at the fuse portion.

14. The method for manufacturing an integrated circuit device according to claim 12, wherein forming the fuse portion comprises:

forming a first insulation film on an integrated circuit substrate;

forming a metal layer on the first insulation film;

forming a bit line and a fuse line by patterning the metal layer wherein the bit line is formed in a cell array region of the integrated circuit substrate and the fuse line is formed at the fuse portion in a peripheral circuit region of the integrated circuit substrate; and forming a second insulation film on the first insulation film to cover the bit and the fuse lines.

15. The method for manufacturing an integrated circuit device according to claim 12, wherein the step of forming a first interlayer dielectric further comprises the steps of:

forming the first interlayer dielectric on an integrated circuit substrate where the fuse portion is formed;

forming a first fuse contact hole having a rectangular shape and enclosing the fuse portion in the first interlayer dielectric to expose a portion of the etch stop film;

forming a first metal layer filling up the first fuse hole on the first interlayer dielectric; and forming a first fuse contact plug in the first fuse contact hole by etching the first metal layer until the first interlayer dielectric is exposed.

16. The method for manufacturing an integrated circuit device according to claim 12, wherein the etch stop film is simultaneously formed when a plate electrode is formed in a cell array region of the integrated circuit substrate.

17. A method for manufacturing an integrated circuit device comprising the steps of:

forming an insulation film on an integrated circuit substrate to cover a fuse portion of the integrated circuit device;

forming a first interlayer dielectric having a first metal plug enclosing the fuse portion;

forming a first metal layer pattern on the first metal plug and the first interlayer dielectric adjacent to the metal plug, the first metal layer pattern enclosing the fuse portion;

forming a second interlayer dielectric having a second metal plug enclosing the fuse portion and a first opening partially exposing the fuse portion;

forming a second metal layer pattern from the second metal plug and the second interlayer dielectric adjacent to the second metal plug, the second metal layer pattern enclosing the fuse portion; and forming an etch stop film pattern on the insulation film to cover the fuse portion, the etch stop film contacting the first metal plug enclosing the fuse porition.

18. The method for manufacturing an integrated circuit device according to claim 17, further comprising the steps of:

forming a passivation layer covering the second metal layer pattern; and forming a fuse opening by partially etching the passivation layer on the fuse portion, the first interlayer dielectric, and the etch stop film pattern until the insulation film is exposed.

19. The method for manufacturing an integrated circuit device according to claim 17, further comprising the steps of:

forming a polysilicon layer for forming a plate electrode of an integrated circuit memory device; and simultaneously forming the plate electrode and the etch stop film pattern by patterning the polysilicon layer.

20. The method for manufacturing an integrated circuit device according to claim 17, wherein the step of forming the first interlayer dielectric further comprises the steps of:

forming an interlayer dielectric on the insulation film;

forming a fuse contact hole in the interlayer dielectric, the fuse contact hole partially exposing the etch stop film pattern and enclosing the fuse portion;

forming a metal layer filling up the fuse contact hole on the interlayer dielectric; and etching the metal layer to provide the first metal plug in the fuse contact hole.

* * * * *